(12) United States Patent
Lee et al.

(10) Patent No.: US 12,279,482 B2
(45) Date of Patent: Apr. 15, 2025

(54) LIGHT EMITTING DISPLAY DEVICE

(71) Applicant: Samsung Display Co., LTD., Yongin-si (KR)

(72) Inventors: Hyeon Bum Lee, Hwaseong-si (KR); Seong Min Wang, Seongnam-si (KR); Chi Wook An, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 518 days.

(21) Appl. No.: 17/699,160

(22) Filed: Mar. 20, 2022

(65) Prior Publication Data

US 2022/0415980 A1    Dec. 29, 2022

(30) Foreign Application Priority Data

Jun. 29, 2021    (KR) .................. 10-2021-0084533

(51) Int. Cl.
*H10K 59/122* (2023.01)
*H10K 50/844* (2023.01)
(Continued)

(52) U.S. Cl.
CPC ......... *H10K 59/122* (2023.02); *H10K 50/844* (2023.02); *H10K 50/865* (2023.02);
(Continued)

(58) Field of Classification Search
CPC .. H10K 59/122; H10K 50/844; H10K 50/865; H10K 59/1213; H10K 59/131; H10K 59/38; H10K 59/40; H10K 77/111; H10K 2102/311; H10K 59/873; H10K 59/8792; H10K 59/124; Y02E 10/549;
(Continued)

(56) References Cited

U.S. PATENT DOCUMENTS

| 11,106,297 B2 | 8/2021 | Kim et al. |
| 2018/0061899 A1* | 3/2018 | Oh ................. H10K 59/8722 |

(Continued)

FOREIGN PATENT DOCUMENTS

| KR | 10-2019-0069240 | 6/2019 |
| KR | 10-2021-0004008 | 1/2021 |

(Continued)

*Primary Examiner* — Kyoung Lee
*Assistant Examiner* — Sophia W Kao
(74) *Attorney, Agent, or Firm* — KILE PARK REED & HOUTTEMAN PLLC

(57) ABSTRACT

A light emitting display device includes: a flexible substrate including a display area and a peripheral area having a bending area. The display area includes: a plurality of inorganic layers; first and second organic layers that are disposed on the plurality of inorganic layers; a black pixel defining layer that is disposed on the second organic layer; and a spacer that is disposed on the black pixel defining layer. In the bending area, the plurality of inorganic layers include a first opening formed at a position corresponding to the bending area. The first opening is filled with the first organic layer, the second organic layer is disposed on the first organic layer, the black pixel defining layer includes a second opening at a position corresponding to the bending area, and the second opening is filled with an organic layer for the spacer, formed of a same material as the spacer.

39 Claims, 17 Drawing Sheets

(51) Int. Cl.
  *H10K 50/86* (2023.01)
  *H10K 59/121* (2023.01)
  *H10K 59/131* (2023.01)
  *H10K 59/38* (2023.01)
  *H10K 59/40* (2023.01)
  *H10K 77/10* (2023.01)
  *H10K 102/00* (2023.01)

(52) U.S. Cl.
  CPC ....... *H10K 59/1213* (2023.02); *H10K 59/131* (2023.02); *H10K 59/38* (2023.02); *H10K 59/40* (2023.02); *H10K 77/111* (2023.02); *H10K 2102/311* (2023.02)

(58) Field of Classification Search
  CPC ...... G09F 9/301; G06F 1/1616; G06F 1/1652; G06F 3/0412
  See application file for complete search history.

(56) References Cited

U.S. PATENT DOCUMENTS

| | | | |
|---|---|---|---|
| 2018/0175311 A1* | 6/2018 | Jin | H10K 59/12 |
| 2019/0095007 A1* | 3/2019 | Jeong | H10K 59/873 |
| 2019/0096974 A1* | 3/2019 | Kim | H10K 59/131 |
| 2019/0165081 A1* | 5/2019 | Lee | H10K 77/111 |
| 2019/0179466 A1* | 6/2019 | Kim | H10K 59/35 |
| 2020/0176551 A1* | 6/2020 | Park | H10K 59/123 |
| 2021/0005696 A1 | 1/2021 | Bang et al. | |
| 2021/0091144 A1* | 3/2021 | Won | H10K 77/111 |
| 2021/0126060 A1 | 4/2021 | Koo et al. | |
| 2021/0200361 A1* | 7/2021 | Park | G06F 3/0412 |
| 2021/0264820 A1* | 8/2021 | Wang | B32B 27/36 |

FOREIGN PATENT DOCUMENTS

| | | |
|---|---|---|
| KR | 10-2021-0049253 | 5/2021 |
| KR | 10-2023-0003684 | 1/2023 |

* cited by examiner

LIGHT EMITTING DISPLAY DEVICE

CROSS-REFERENCE TO RELATED APPLICATION

This application claims priority from and the benefit of Korean Patent Application No. 10-2021-0084533, filed on Jun. 29, 2021, which is hereby incorporated by reference for all purposes as if fully set forth herein.

BACKGROUND

Field

Embodiments of the invention relate generally to a light emitting display device, and more specifically, it relates to a light emitting display device that reduces reflectance of external light without using a polarizer.

Discussion of the Background

A display device is a device that displays an image on a screen, and includes a liquid crystal display (LCD), an organic light emitting diode (OLED) device, and the like. Such a display device is used in various electronic devices such as a portable phone, a navigation device, a digital camera, an electronic book, a portable game machine, or various terminals.

A display device such as an organic light emitting diode device may have a structure in which the display device can be bent or folded using a flexible substrate.

In addition, in small electronic devices such as portable phones, optical elements such as cameras and optical sensors are formed in a bezel area around the display area, but as a size of a peripheral area of the display area is gradually reduced while a size of a screen to be displayed is increased, a technology that allows a camera or an optical sensor to be disposed on the back of the display area has been developed.

The above information disclosed in this Background section is only for understanding of the background of the inventive concepts, and, therefore, it may contain information that does not constitute prior art.

SUMMARY

Embodiments have been made to provide a light emitting display device of which a non-display area is reduced by folding a substrate to a rear side. In addition, embodiments have been made to provide a light emitting display device that enables monitoring and alignment by removing a black pixel defining layer from at least some peripheral areas of a display panel using a black pixel defining layer in a display area.

Additional features of the inventive concepts will be set forth in the description that follows, and in part will be apparent from the description, or may be learned by practice of the inventive concepts.

A light emitting display device according to an embodiment includes a flexible substrate that includes a display area and a peripheral area including a bending area, wherein the display area includes: a plurality of inorganic layers; a first organic layer and a second organic layer that are disposed on the plurality of inorganic layers; a black pixel defining layer that is disposed on the second organic layer; and a spacer that is disposed on the black pixel defining layer, wherein, in the bending area, the plurality of inorganic layers include a first opening where at least a part of the plurality of inorganic layers is removed formed at a position corresponding to the bending area, the first opening is filled with the first organic layer, the second organic layer is disposed on the first organic layer, the black pixel defining layer includes a second opening at a position corresponding to the bending area, and the second opening is filled with an organic layer for the spacer, formed of a same material as the spacer.

The light emitting display device may further include a planarization layer that is disposed on the spacer and the organic layer for the spacer, wherein the planarization layer includes a third opening at a position corresponding to the bending area.

Widths of the first opening, the second opening, and the third opening may be larger than a width of the bending area.

Fan-out wiring may be formed in the bending area, and disposed on the bending area and covered by the second organic layer.

The fan-out wiring may contact a top surface of the plurality of inorganic layers in the peripheral area that is adjacent to the bending area.

The peripheral area may further include: a pad portion for a driver, electrically connected with the fan-out wiring and electrically connected with a chip-type driver; and a pad portion for a circuit pad, electrically connected with a flexible printed circuit board.

The display area may further include: an encapsulation layer that covers a pixel circuit portion, a light emitting diode electrically connected with the pixel circuit portion and the light emitting diode; a sensing electrode that is formed on the encapsulation layer and senses a touch; and sensing insulating layers that are disposed above and below the sensing electrode.

The encapsulation layer may extend up to between the bending area of the peripheral area and the display area.

Each of the pad portion for the driver and the pad portion for the circuit board may include: a first pad electrode that is formed of a same material as the fan-out wiring; a second pad electrode that is formed of a same material as the sensing electrode; and a first additional pad electrode that is disposed closer to the substrate than the first pad electrode.

The pad portion for the driver may further include a second additional pad electrode that is disposed closer to the substrate than the first additional pad electrode.

The pixel circuit portion may include a transistor including a semiconductor layer and a gate electrode, the first additional pad electrode may be formed of a same material as a conductive layer that is directly connected with a semiconductor layer of the transistor, and the second additional pad electrode may be formed of a same material as the gate electrode.

The bending area may further include additional fan-out wiring that is disposed between the first organic layer and the plurality of inorganic layers, and the additional fan-out wiring may be formed of the same material as the first additional pad electrode.

The sensing electrode may include a connection wire extending to be electrically connected with the driver or the flexible printed circuit board.

A first dam and a second dam that is higher than the first dam in height may be disposed in a first peripheral area where the encapsulation layer is formed in the peripheral area, and the second dam may be disposed further from the display area than the first dam.

The first dam and the second dam may be disposed on the plurality of inorganic layers, the first dam includes a first sub-dam region of the first dam formed of the second organic layer and a second sub-dam region of the first dam formed of an organic layer for the spacer, the second dam may include a first sub-dam region of the second dam formed of the first organic layer, a second sub-dam region of the second dam formed of the second organic layer, and a third sub-dam region of the second dam formed of the organic layer for the spacer.

A light blocking layer and a color filter may be disposed on the sensing electrode and the sensing insulating layer of the display area, and the light blocking layer may extend to the first peripheral area and contacts the planarization layer in the first peripheral area.

The spacer of the display area may include a first portion, and a second portion that is lower than the first portion in height and integrally formed with the first portion.

A light emitting display device according to an embodiment includes: a flexible substrate that includes a peripheral area including a plurality of dams and a bending area, and a display area, wherein the plurality of dams include a first dam disposed on a plurality of inorganic layers, and a second dam that is higher than the first dam in height, and the second dam includes a first sub-dam region of the second dam formed of a first organic layer on the plurality of inorganic layers, a second sub-dam region of the second dam formed of a second organic layer, and a third sub-dam region of the second dam that is formed of the same material as a spacer layer formed in the display area, the first dam includes a first sub-dam region of the first dam formed of a second organic layer on the plurality of inorganic layers, and a second sub-dam region of the first dam that is formed of the same material as the spacer layer, and, in the bending area, the plurality of inorganic layers include a first opening where at least a part of the plurality of inorganic layers is removed formed at a position corresponding to the bending area, the first opening is filled with the first organic layer, the second organic layer is disposed on the first organic layer, and a spacer layer that is formed of the same material as the spacer is formed on the second organic layer.

A black pixel defining layer may be disposed in the display area, and the black pixel defining layer may include a second opening at a position corresponding to the bending area, and the second opening may be filled with the spacer layer.

The light emitting display device may further include the spacer and the spacer layer, wherein the planarization layer may include a third opening at a position corresponding to the bending area.

According to the embodiments, the black pixel defining layer is removed in the bending area of the display panel using the black pixel defining layer in the display area and thus it can be more easily folded to the rear side. In addition, in the display panel that uses the black pixel defining layer in the display area, the black pixel defining layer is removed from at least some peripheral areas to enable monitoring and alignment.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
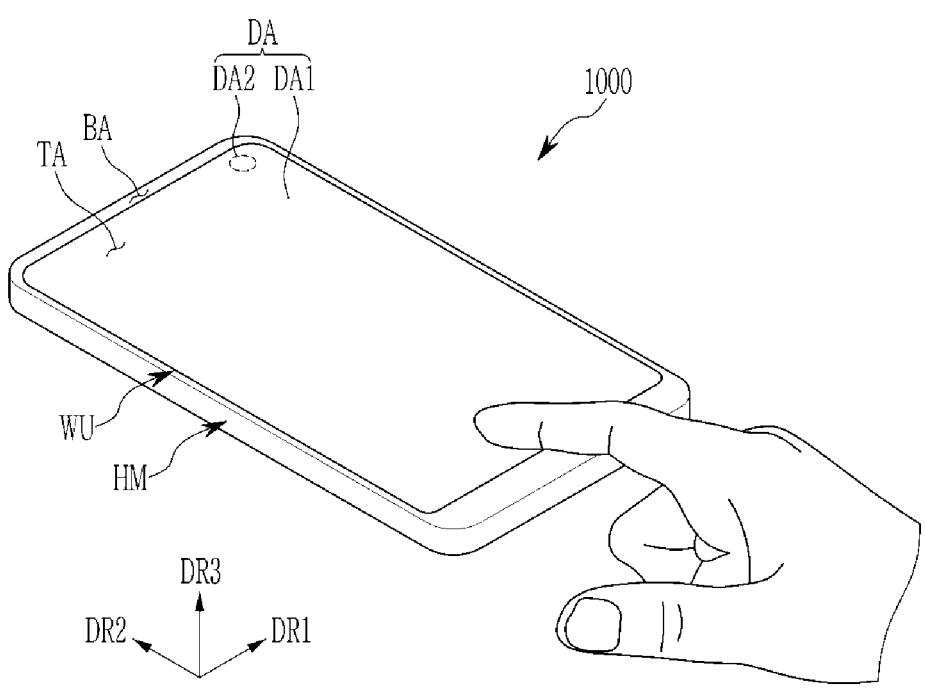
FIG. 1 is a schematic perspective view of a use stage of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a structure of a light emitting display device will be schematically described with reference to FIG. 1 to FIG. 3.

Figure 2:
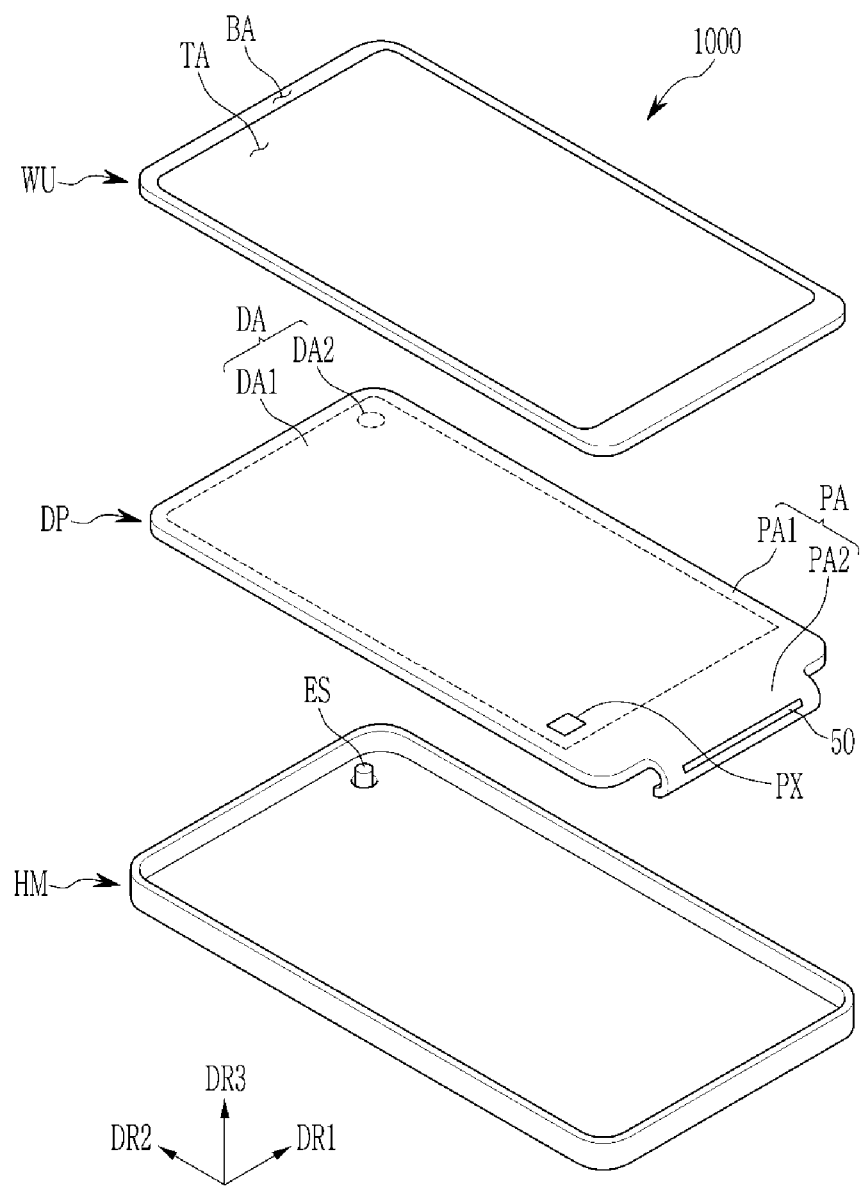
FIG. 2 is an exploded perspective view of the display device according to the embodiment.
Figure 3:
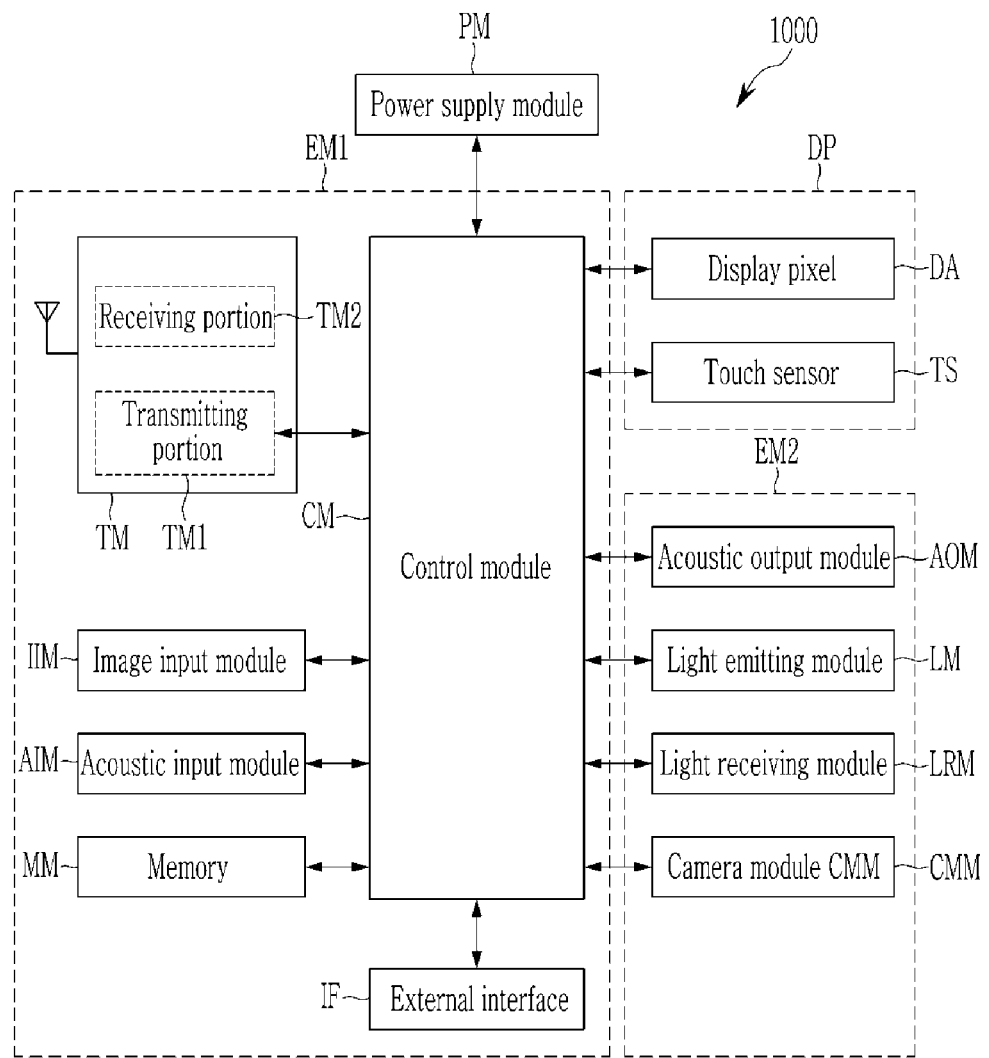
FIG. 3 is a block diagram of the display device according to the embodiment.

FIG. 1 is a schematic perspective view of a use stage of a display device according to an embodiment that is constructed according to principles of the invention, FIG. 2 is an exploded perspective view of the display device according to the embodiment, and FIG. 3 is a block diagram of the display device according to the embodiment.

A light emitting display device 1000 according to an embodiment is a device for displaying a motion picture or still image, and may be used as a display screen of not only portable electronic devices such as a mobile phone, a smart phone, a tablet personal computer, a mobile communication terminal, an electronic notebook, a portable multimedia player (PMP), a navigation device, an ultra mobile PC (UMPC), and the like, but also various products such as a television, a laptop, a monitor, an advertisement board, an Internet of things (JOT), and the like. In addition, the light emitting display device 1000 according to the embodiment may be used in a wearable device such as a smart watch, a watch phone, a glasses display, and a head mounted display (HMD). In addition, the light emitting display device 1000 according to the embodiment is a vehicle's dashboard or a center information display (CID) disposed on the center fascia or dashboard of the vehicle, and a room mirror display that replaces a side mirror of the vehicle, or a display disposed on the back of the front seat of the vehicle for entertainment. FIG. 1 illustrates that the light emitting display device 1000 is used for a smart phone for better comprehension and ease of description.

Referring to FIG. 1, FIG. 2, and FIG. 3, the light emitting display device 1000 may display an image toward a third direction DR3 on a display surface parallel to each of a first direction DR1 and a second direction DR2. A display surface on which an image is displayed may correspond to a front surface of the light emitting display device 1000, and may correspond to a front surface of a cover window WU. The image may include static images as well as dynamic images.

In the embodiment, a front (or top) and back (or bottom) of each member are defined based on the direction in which the image is displayed. The front and rear surfaces may be opposite to each other in the third direction DR3, and the normal directions of the front and rear surfaces may be parallel to the third direction DR3. A separation distance between the front and rear surfaces in the third direction DR3 may correspond to a thickness of a light emitting display panel DP in the third direction DR3.

The light emitting display device 1000 according to the embodiment may detect a user's input (refer to the hand in FIG. 1) applied from the outside. A user's input may include various types of external inputs such as a part of the user's body, light, heat, or pressure. In the embodiment, the user's input is shown with the user's hand applied to the front. However, the present invention is not limited thereto. The user's input may be provided in various forms, and the light emitting display device 1000 may sense the user's input applied to the side or rear surface of the light emitting display device 1000 according to the structure of the light emitting display device 1000.

The light emitting display device 1000 may include a display area DA and non-display area PA disposed around the display area DA. The display area DA may be broadly divided into a first display area DA1 and a first element area DA2 (hereinafter, also referred to as a component area or a second display area), and in the embodiment, the first display area DA1 may include a plurality of pixels for displaying an image, and the first element area DA2 may include a light transmissive area and may additionally include a pixel for displaying an image. The first element area DA2 may be a region that at least partially overlaps with an optical element ES such as a camera or an optical sensor. In FIG. 1, the first element area DA2 is shown to be provided in a circle shape on an upper right side of the light emitting display device 1000, but the present invention is not limited thereto. The first element area DA2 may be provided in various numbers and shapes according to the number and shape of the optical elements ES.

The light emitting display device 1000 may receive an external signal required for the optical element ES through the first element area DA2, or may externally provide a signal output from the optical element ES. In the embodiment, the first element area DA2 is provided to overlap the light transmissive area, and thus the area of a blocking area BA for forming the light transmissive area can be reduced. Here, the light blocking BA may include a bezel area as a region having relatively low light transmittance compared to the transmissive area TA.

The light emitting display device 1000 may include a cover window WU, a housing member HM, a light emitting display panel DP, and an optical element ES. In the embodiment, the cover window WU and the housing member HM may be combined to form the appearance of the light emitting display device 1000.

The cover window WU may include an insulating panel. For example, the cover window WU may be made of glass, plastic, or a combination thereof.

A front side of the cover window WU may define a front side of the light emitting display device 1000. The transmissive area TA may be an optically transparent region. For example, the transmissive area TA may be a region having a visible ray transmittance of about 90 or more.

The light blocking BA may define the shape of the transmissive area TA. The light blocking BA may surround the transmissive area TA while being adjacent to the transmissive area TA. The light blocking BA may be a region having relatively low light transmittance compared to the transmissive area TA. The light blocking BA may include an opaque material that blocks light. The light blocking BA may have a predetermined color. The light blocking BA may be defined by a bezel layer provided separately from a transparent substrate defining the transmissive area TA, or by an ink layer formed by inserting or coloring the transparent substrate.

The light emitting display panel DP may include a display panel DP displaying an image, a touch sensing portion TS sensing an external input, and a driver 50. The light emitting display panel DP may include a front surface including a display area DA and a peripheral area PA. The display area DA may be a region in which a pixel operates and emits light according to an electrical signal.

In the embodiment, the display area DA may be a region where pixels are included and thus an image is displayed, and simultaneously a region where a touch sensing portion TS is disposed on an upper side in the third direction DR3 of the pixel to detect an external input.

The transmissive area TA of the cover window WU may at least partially overlap the display area DA of the light emitting display panel DP. For example, the transmissive area TA may overlap the front surface of the display area DA or may overlap at least a portion of the display area DA. Accordingly, the user may recognize an image through the transmissive area TA or provide an external input based on the image. However, the present invention is not limited thereto. For example, in the display area DA, a region where an image is displayed and a region where an external input is sensed may be separated from each other.

The peripheral area PA of the light emitting display panel DP may at least partially overlap the light blocking BA of the cover window WU. The peripheral area PA may be a region covered by the light blocking BA. The peripheral area PA may surround the display area DA, while being adjacent to the display area DA. An image is not displayed in the peripheral area PA, and a driving circuit or driving wiring for driving the display area DA may be disposed. The peripheral area PA may include a first peripheral area PA1 disposed outside the display area DA, a second peripheral area PA2 including a driver 50, connection wiring, and a bending area. In the embodiment of FIG. 2, the first peripheral area PA1 is disposed outside the three surfaces of the display area DA, and the second peripheral area PA2 is disposed outside the remaining side of the display area DA.

In the embodiment, the light emitting display panel DP may be assembled in a flat state with the display area DA and the peripheral area PA facing the cover window WU. However, embodiments of the inventive concepts are not limited thereto. In this case, a portion of the peripheral area PA faces the rear surface of the light emitting display device 1000, and thus the light blocking BA shown on the front surface of the light emitting display device 1000 may be reduced, and in FIG. 2, the second peripheral area PA2 is bent and thus may be assembled after being located on the rear surface of the display area DA.

The display area DA may include a first display area DA1 and a first element area DA2. The first element area DA2 includes a light transmissive area and thus may have relatively high light transmittance compared to the first display area DA1. In addition, the first element area DA2 may have a relatively smaller area than the first display area DA1. The first element area DA2 may be defined as a region overlapping a region where the optical element ES is disposed inside the housing member HM among the light emitting display panel DP. In the embodiment, the first element area DA2 is illustrated as a circle shape, but the present invention is not limited thereto, and the first element area DA2 may have various shapes such as polygons, ellipses, and a shape with at least one curved line.

The first display area DA1 may be adjacent to the first element area DA2. In the embodiment, the first display area DA1 may surround the entire first element area DA2. However, the present invention is not limited thereto. The first display area DA1 may partially surround the first element area DA2.

Referring to FIG. 3, the light emitting display panel DP may include a display area DA including a display pixel and a touch sensing portion TS. The light emitting display panel DP includes the pixel that generates an image, and may be visually recognized by the user from the outside through the transmissive area TA. In addition, the touch sensing portion TS may be disposed on the top of the pixel and may sense an external input applied from the outside. The touch sensing portion TS may sense an external input provided to the cover window WU.

Referring back to FIG. 2, the second peripheral area PA2 may include a bending area. The display area DA and the first peripheral area PA1 may have a flat state substantially parallel to a plane defined by the first direction DR1 and the second direction DR2, and one side of the second peripheral area PA2 may extend from a flat state, pass through a bending area, and then have a flat state again. As a result, at least a part of the second peripheral area PA2 may be bent and assembled to be disposed on the rear surface of the display area DA. Since at least a part of the second peripheral area PA2 overlaps the display area DA on a plane when assembled, the light blocking BA of the light emitting display device 1000 may be reduced. The bending area according to the embodiment may have a structure (e.g., a structure such as in FIG. 11) to be described later in more detail.

The driver 50 may be mounted on the second peripheral area PA2, and may be mounted on the bending area or disposed on either side of the bending area. The driver 50 may be provided in the form of a chip, and the driver 50 may be electrically connected through a pad portion (hereinafter, also referred to as a pad portion for a driver) to be described later in more detail.

The driver 50 may be electrically connected to the display area DA to transmit an electrical signal to the display area DA. For example, the driver 50 may provide data signals to pixels PX that are disposed in the display area DA. Alternatively, the driver 50 may include a touch driving circuit, and may be electrically connected with the touch sensing portion TS disposed in the display area DA. The driver 50 may include various circuits in addition to the circuits described above or may be designed to provide various electrical signals to the display area DA.

In the light emitting display device 1000, a pad portion (hereinafter, also referred to as a pad portion for a circuit board) may be located at an end of the second peripheral area PA2, and may be electrically connected with a flexible printed circuit board FPCB including a driving chip by the pad portion. Here, the driving chip located in the flexible printed circuit board may include various driving circuits for driving the light emitting display device 1000 or a connector for power supply. Depending on various implementations of the embodiments described herein, a rigid printed circuit board (PCB) may be used instead of the flexible printed circuit board The optical element ES may be disposed under the light emitting display panel DP. The optical element ES may receive an external input transmitted through the first element area DA2 or may output a signal through the first element area DA2. In the embodiment, since the first element area DA2 having relatively high transmittance is provided inside the display area DA, the optical element ES can be disposed to overlap the display area DA and thus the area (or size) of the light blocking BA can be reduced.

Referring to FIG. 3, the light emitting display device 1000 may include a light emitting display panel DP, a power supply module PM, a first electronic module EM1, and a second electronic module EM2. The light emitting display panel DP, the power supply module PM, the first electronic module EM1, and the second electronic module EM2 may be electrically connected to each other. In FIG. 3, among the configuration of the light emitting display panel DP, a display pixel and the touch sensing portion TS disposed in the display area DA are illustrated as an example.

The power supply module PM may supply power required for the overall operation of the light emitting display device 1000. The power supply module PM may include a conventional battery module.

The first electronic module EM1 and the second electronic module EM2 may include various functional modules for operating the light emitting display device 1000. The first electronic module EM1 may be directly mounted on a motherboard electrically connected to the display panel DP, or mounted on a separate substrate and electrically connected to the motherboard through a connector.

The first electronic module EM1 may include a control module CM, a wireless communication module TM, an image input module IIM, an audio input module AIM, a memory MM, and an external interface IF. Some of the modules are not mounted on the motherboard, but may be electrically connected to the motherboard through the flexible printed circuit board connected thereto.

The control module CM may control the overall operation of the light emitting display device 1000. The control module CM may be a microprocessor. For example, the control module CM activates or deactivates the display panel DP. The control module CM may control other modules such as image input module IIM or audio input module AIM based on the touch signal received from the display panel DP.

The wireless communication module TM may transmit/receive a wireless signal with another terminal using a Bluetooth or Wi-Fi line. The wireless communication module TM may transmit/receive voice signals using a general communication line. The wireless communication module TM includes a transmitter TM1 that modulates and transmits a signal to be transmitted, and a receiver TM2 that demodulates a received signal.

The image input module IIM may process the image signal and convert the processed image signal into image data that can be displayed on the light emitting display panel DP. The audio input module AIM may receive an external audio signal input by a microphone in a recording mode, a voice recognition mode, and the like, and convert the audio signal into electrical voice data.

The external interface IF may serve as an interface connected to an external charger, a wired/wireless data port, a card socket (e.g., a memory card, a SIM/UIM card), and the like.

The second electronic module EM2 may include an audio output module AOM, an emissive module LM, a light receiving module LRM, a camera module (CMM), and the like, and some of them may be disposed as the optical elements ES on the rear surface of the display area DA as shown in FIG. 1 and FIG. 2. As the optical element ES, an emissive module LM, a light receiving module LRM, and a camera module CMM can be included. In addition, the second electronic module EM2 may be directly mounted on the motherboard, mounted on a separate substrate and electrically connected to the light emitting display panel DP through a connector, or electrically connected to the first electronic module EM1.

The audio output module AOM may convert the audio data received from the wireless communication module TM or the audio data stored in the memory MM and output the converted data to the outside.

The emissive module LM may generate and output light. The emissive module LM may output infrared light. For example, the emissive module LM may include an LED element. For example, the light receiving module LRM may detect infrared light. The light receiving module LRM may be activated when infrared light above a predetermined level is detected. The light receiving module LRM may include a CMOS sensor. After the infrared light generated by the emissive module LM is output, it is reflected by an external subject (e.g., a user's finger or face), and the reflected infrared light can be incident on the light receiving module LRM. The camera module CMM may take a photograph of an external image.

In the embodiment, the optical element ES may additionally include a light sensing sensor or a thermal sensing sensor. The optical element ES may detect an external object received through a front surface or may provide a sound signal such as voice through the front surface to the outside. In addition, the optical element ES may include a plurality of configurations, and is not limited to any one embodiment.

Referring back to FIG. 2, the housing member HM may be combined with the cover window WU. The cover window WU may be disposed in front of the housing member HM. The housing member HM may be combined with the cover window WU to provide a predetermined accommodation space. The light emitting display panel DP and optical element ES may be accommodated in a predetermined accommodation space provided between the housing member HM and the cover window WU.

The housing member HM may include a material with relatively high stiffness. For example, the housing member HM may include a plurality of frames and/or plates made of glass, plastic, or metal, or a combination thereof. The housing member HM can reliably protect the components of the light emitting display device 1000 accommodated in the interior space from external impact.

In FIG. 1 and FIG. 2, the optical element ES is disposed within the display area DA, but depending on embodiments, the optical element ES may be disposed in the peripheral area PA outside the display area DA, and in this case, an area where light can be transmitted may be formed in the light blocking BA of the cover window WU.

In FIG. 1 and FIG. 2, a light emitting display panel for a mobile phone is illustrated, but the present embodiment is applicable to a light emitting display panel in which an optical element can be positioned on the rear surface thereof, and it may also be a flexible display panel. The case of a foldable display panel among flexible display panels will be described hereinafter with reference to FIG. 4 and FIG. 5.

Figure 4:
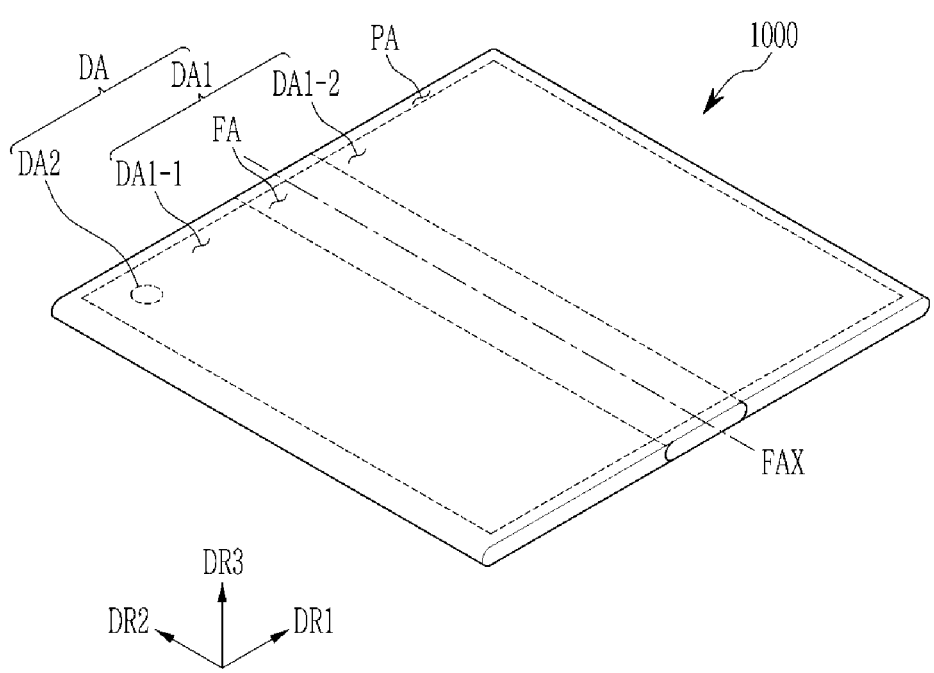
FIG. 4 is a schematic perspective view of a light emitting display device according to another embodiment.
Figure 5:
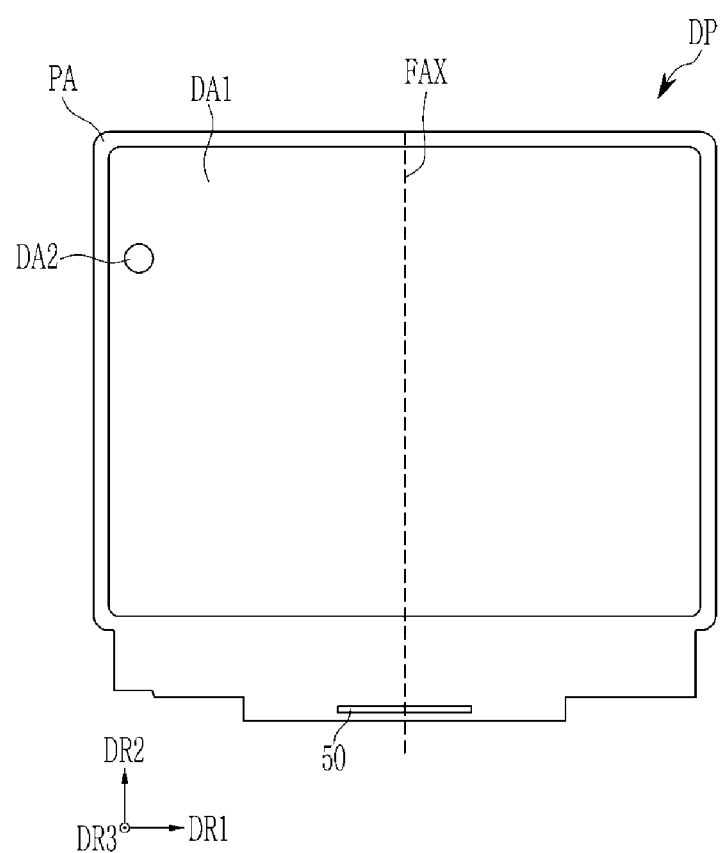
FIG. 5 is a top plan view of a first element area of a light emitting display panel according to the other embodiment.

FIG. 4 is a schematic perspective view of a light emitting display device according to another embodiment, and FIG. 5 is a top plan view of a first element area of a light emitting display panel according to the other embodiment.

Unlike the embodiment shown in FIG. 1, in the embodiment of FIG. 4 and FIG. 5, a foldable light emitting display panel having a structure that can be bent through a folding line FAX is illustrated.

As shown in FIG. 4 and FIG. 5, a component area DA2 may be disposed at one edge in the foldable light emitting display panel DP.

An optical element such as a camera or an optical sensor is disposed on the rear surface of the component area DA2 of FIG. 4 and FIG. 5, and a light transmissive area LTA is disposed in the component area DA2.

Referring to FIG. 4, in the embodiment, a light emitting display device 1000 may be a foldable light emitting display device. The light emitting display device 1000 can be folded outwardly or inwardly based on the folding axis FAX. When the light emitting display device 1000 is folded outwardly based on the folding axis FAX, a display surface of the light emitting display device 1000 is disposed on the outside in the third direction DR3, respectively, and thus images can be displayed in both directions. When the light emitting display device 1000 is folded inwardly based on the folding axis FAX, the display surface may not be visually recognized from the outside.

The light emitting display device 1000 may include a housing, a light emitting display panel, and a cover window.

In the embodiment, the light emitting display panel may include a display area DA and a peripheral area PA. The display area DA may be a region in which an image is displayed, and simultaneously may be a region in which an external input is sensed. The display area DA may be a region in which a plurality of pixels to be described later are disposed.

The display area DA may include a first display area DA1 and a first element area DA2. In addition, the first display area DA1 may be divided into a first region DA1-1 of the first display area DA1, a second region DA1-2 of the first display area DA1, and a folding area FA. The first region DA1-1 of the first display area DA1 and the second region DA1-2 of the first display area DA1 may be disposed on the left and right sides, respectively, based on (or at the center) of the folding axis FAX, and the folding area FA may be disposed between the first region DA1-1 of the first display area DA1 and the second region DA1-2 of the first display area DA1. In this case, when folded outwardly based on the folding axis FAX, the first region DA1-1 of the first display area DA1 and the second region DA1-2 of the first display area DA2 are disposed on both sides in the third direction DR3, and images can be displayed in both directions. In addition, when folded inwardly based on the folding axis FAX, the first region DA1-1 of the first display area DA1 and the second region DA1-2 of the first display area DA1 may not be visible from the outside.

In FIG. 5, the peripheral area PA is also illustrated outside the display area DA, and the driver 50 is also illustrated in the peripheral area PA. In the embodiment of FIG. 5, it is illustrated that the driver 50 is disposed in a portion corresponding to the folding line FAX, but the position of the driver 50 may vary in other implementations of the embodiment.

Hereinafter, a structure of the display panel DP will be described in detail with reference to FIG. 6.

Figure 6:
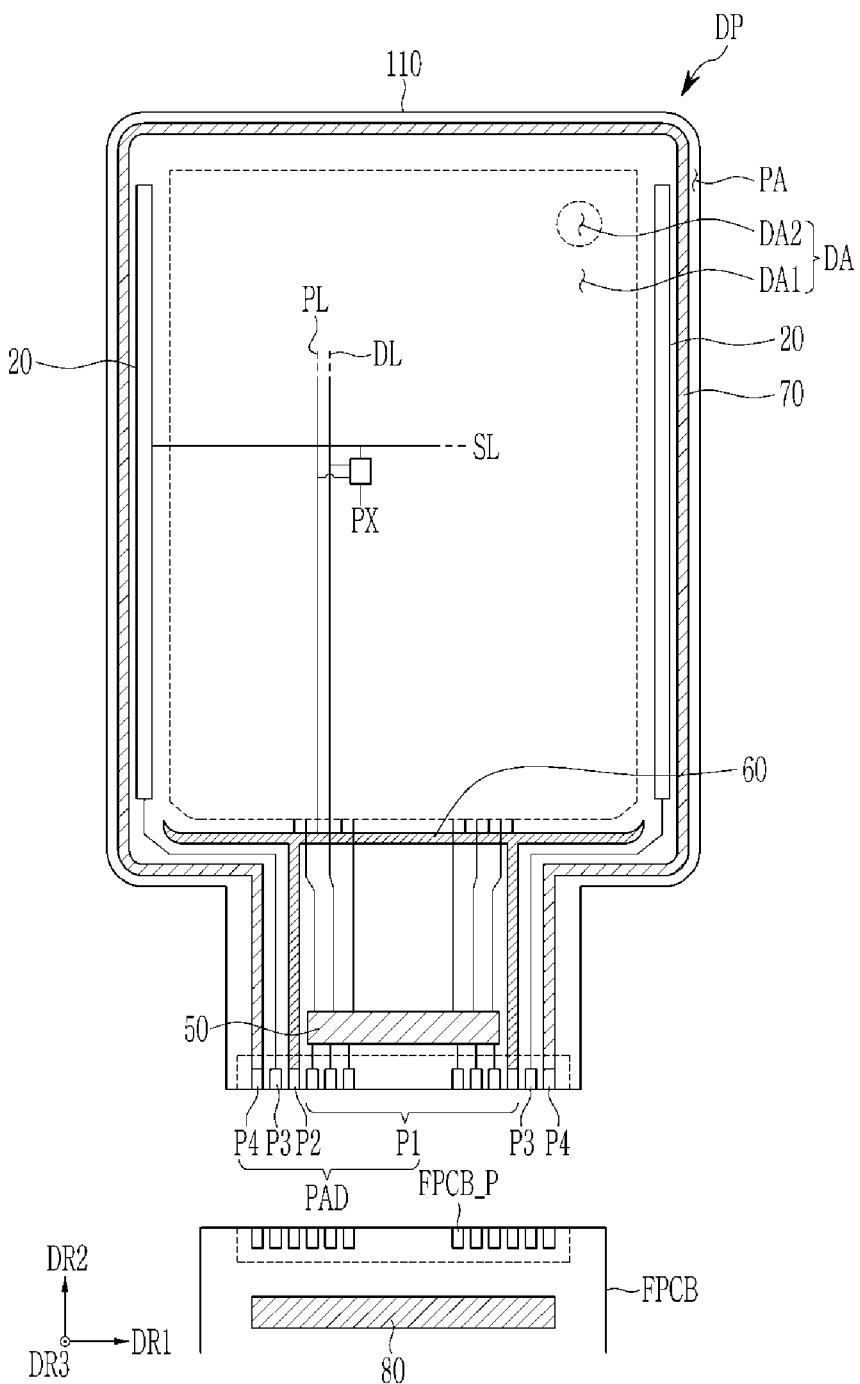
FIG. 6 is a top plan view of some constituent elements of the display panel according to the embodiment.

FIG. 6 is a top plan view of some constituent elements of the display panel according to the embodiment.

Referring to FIG. 6, the display panel DP may be divided into the display area DA and the peripheral area PA, and the peripheral area PA may be defined along the edge of the display area DA. A first element area DA2 including a light transmissive area is disposed within the display area DA.

The display panel DP includes a plurality of pixels PX. The plurality of pixels PX may be disposed in the display area DA. Each of the pixels PX includes a light emitting element and a pixel circuit unit connected thereto. Each pixel PX emits light of, for example, red, green, and blue, or white, and may include, for example, an organic light emitting diode.

The display panel DP may include a plurality of signal lines and a pad portion. The plurality of signal lines may include a scan line SL extending in a first direction DR1, a data line DL and a driving voltage line PL extending in a second direction DR2, and the like.

The scan driver 20 is disposed on the left and right of the display area DA, and generates and transmits a scan signal to each pixel PX through the scan line SL. The pixel PX may receive scan signals from two scan drivers 20 disposed on the left and right sides together.

A pad portion PAD (hereinafter, also referred to as a pad portion for a circuit board) is disposed at one end of the peripheral area PA among the display panel DP, and may include a plurality of terminals P1, P2, P3, and P4. The pad portion PAD is not covered by an insulating layer and is exposed such that it can be electrically connected to the flexible printed circuit board FPCB. The pad portion PAD may be electrically connected to a pad portion FPCB_P of the flexible printed circuit board FPCB. The flexible printed circuit board FPCB may transmit the signal or power of an IC driving chip 80 to the pad portion PAD.

The IC driving chip 80 converts a plurality of image signals transmitted from the outside into a plurality of image data signals, and transmits the changed signals to the data driver 50 through the terminal P1. In addition, the IC driving chip 80 receives a vertical synchronization signal, a horizontal synchronizing signal, and a clock signal, generates a control signal to control the operation of the scan driver 20 and the data driver 50, and transmits the control signal to the scan driver 20 and the data driver 50 through the terminals P3 and P1. The IC driving chip 80 transmits a driving voltage ELVDD to driving voltage supply wiring 60 through the terminal P2. In addition, the IC driving chip 80 may transmit a common voltage ELVSS to each common voltage supply wiring 70 through the terminal P4.

The data driver 50 is disposed on the peripheral area PA, generates a data voltage DATA to be applied to each pixel PX, and transmits the data voltage DATA to each data line DL. The data driver 50 may be disposed on one side of the display panel DP, and may be disposed between the pad portion PAD and the display area DA, for example. Referring to FIG. 6, a data line DL connected to pixels PX, excluding the pixels PX located on an upper side and a lower side of the second direction DR2 along the first element area DA2, may extend along the second direction DR2 and may have a straight line structure. On the contrary, a data line DL connected to the pixels PX disposed on the upper side and the lower side of the first element area DA2 extends along the second direction DR2, but may include a portion that extends along the periphery of the first element area DA2 at the periphery of the first element area DA2.

The driving voltage supply wiring 60 is disposed on the peripheral area PA. For example, the driving voltage supply wiring 60 may be disposed between the data driver 50 and the display area DA. The driving voltage supply wiring 60 provides a driving voltage ELVDD to the pixels PX. The driving voltage supply wiring 60 may be disposed in the first direction DR1 and may be connected to a plurality of driving voltage lines PL disposed in the second direction DR2.

The common voltage supply wiring 70 is disposed on the peripheral area PA. The common voltage supply wiring 70 may have a shape surrounding a substrate SUB. The common voltage supply wiring 70 transmits the common voltage ELVSS to one electrode (e.g., a cathode) of the light emitting diode included in the pixel PX.

One example of a circuit structure of the pixel PX located in the above-described display panel DL will be described with reference to FIG. 7.

Figure 7:
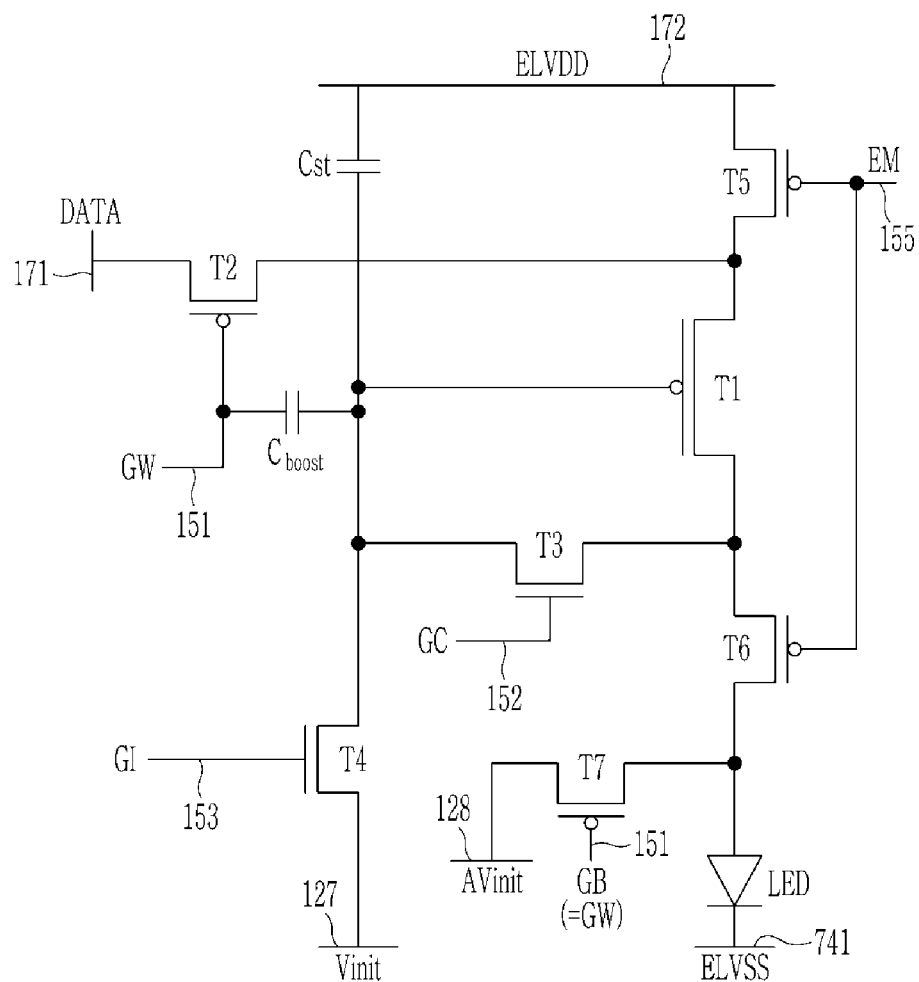
FIG. 7 is a circuit diagram of a pixel included in the light emitting display panel according to the embodiment.

FIG. 7 is a circuit diagram of a pixel included in the light emitting display panel according to the embodiment.

The circuit structure illustrated in FIG. 7 is a circuit structure of a pixel circuit portion and a light emitting diode formed in the first display area DA1 and the first element area DA2.

One pixel according to the embodiment includes a plurality of transistors T1, T2, T3, T4, T5, T6, and T7 connected to a plurality of wires 127, 128, 151, 152, 153, 155, 171, 172, and 741, a storage capacitor Cst, a boost capacitor $C_{boost}$, and a light emitting diode LED. Here, the transistors and the capacitor, excluding the light emitting diode LED, form the pixel circuit portion. Depending on different possible implementations of the embodiments, the boost capacitor $C_{boost}$ can be omitted.

A plurality of wires 127, 128, 151, 152, 153, 155, 171, 172, and 741 are connected to each pixel PX. The plurality of wires include a first initialization voltage line 127, a second initialization voltage line 128, a first scan line 151, a second scan line 152, a initialization control line 153, a light emission control line 155, a data line 171, a driving voltage line 172, and a common voltage line 741. In the embodiment of FIG. 7, the first scan line 151 connected to a seventh transistor T7 is also connected to a second transistor T2, but depending on embodiments, the seventh transistor T7 may be connected with a separate bypass control line unlike the second transistor T2.

The first scan line 151 is connected to the scan driver and transmits a first scan signal GW to the second transistor T2 and the seventh transistor T7. The second scan line 152 may be applied with a voltage of which polarity is opposite to a voltage applied to the first scan line 151 with the same timing as a signal of the first scan line 151. For example, when a negative voltage is applied to the first scan line 151, a positive voltage may be applied to the second scan line 152. The second scan line 152 transmits a second scan signal GC to a third transistor T3. The initialization control line 153 transmits an initialization control signal GI to a fourth transistor T4. The light emission control line 155 transmits an emission control signal EM to a fifth transistor T5 and a sixth transistor T6.

The data line 171 is a wire that transmits a data voltage DATA generated by the data driver, and accordingly, a light emitting current level transmitted to the light emitting diode LED changes such that luminance of the light emitting diode LED also changes. The driving voltage line 172 applies the driving voltage ELVDD. The first initialization voltage line 127 transmits a first initialization voltage Vint, and the second initialization voltage line 128 transmits a second initialization voltage AVint. The common voltage line 741 applies the common voltage ELVSS to the cathode of the light emitting diode LED. In the present embodiment, voltages applied to the driving voltage line 172, the first and second initialization voltage lines 127 and 128, and the common voltage line 741 may be constant voltages.

The driving transistor T1 (also referred to as a first transistor) is a p-type transistor and has a silicon semiconductor as a semiconductor layer. The driving transistor T1 adjusts the light emitting current level output to the anode of the light emitting diode LED according to the magnitude of a voltage of a gate electrode of the driving transistor T1 (i.e., a voltage stored in the storage capacitor Cst). Since brightness of the light emitting diode LED is adjusted according to the light emitting current level output to the anode, luminance of light emission of the light emitting diode LED can be controlled according to the data voltage DATA applied to the pixel. To this end, a first electrode of the driving transistor T1 is disposed to receive the driving voltage ELVDD, and is connected to the driving voltage line 172 via the fifth transistor T5. In addition, the first electrode of the driving transistor T1 is also connected to the second electrode of the second transistor T2 to receive the data voltage DATA. A second electrode of the driving transistor T1 outputs the light emitting current to the light emitting diode LED and is connected to the anode of the light emitting diode LED via the sixth transistor T6 (hereinafter, referred to as an output control transistor). In addition, the second electrode of the driving transistor T1 is also connected to the third transistor T3, and transmits the data voltage DATA applied to the first electrode to the third transistor T3. The gate electrode of the driving transistor T1 is connected to one electrode (hereinafter, referred to as a second storage electrode) of the storage capacitor Cst. Accordingly, the voltage of the gate electrode of the driving transistor T1 changes according to the voltage stored in the storage capacitor Cst, and accordingly, the light emitting current output by the driving transistor T1 is changed. The storage capacitor Cst serves to maintain the voltage of the gate electrode of the driving transistor T1 constant for one frame. The gate electrode of the driving transistor T1 is also connected to the third transistor T3 and thus the data voltage DATA applied to the first electrode of the driving transistor T1 is transmitted to the gate electrode of the driving transistor T1 through the third transistor T3. The gate electrode of the driving transistor T1 is also connected to the fourth transistor T4 and may be initialized by receiving the first initialization voltage Vint.

The second transistor T2 is a p-type transistor and has a silicon semiconductor as a semiconductor layer. The second transistor T2 is a transistor that receives the data voltage DATA into the pixel. The gate electrode of the second transistor T2 is connected to the first scan line 151 and one electrode (hereinafter, referred to as a lower boost electrode) of the boost capacitor $C_{boost}$. A first electrode of the second transistor T2 is connected to the data line 171. A second electrode of the second transistor T2 is connected to the first electrode of the driving transistor T1. When the second transistor T2 is turned on by the negative voltage of the first scan signal GW transmitted through the first scan line 151, the data voltage DATA transmitted through the data line 171 is transmitted to the first electrode of the driving transistor T1, and thus the data voltage DATA is transmitted to the gate electrode of the driving transistor T1 and stored in the storage capacitor Cst.

The third transistor T3 is an n-type transistor and has an oxide semiconductor as a semiconductor layer. The third transistor T3 electrically connects the second electrode of the driving transistor T1 and the gate electrode of the driving transistor T1. As a result, the data voltage DATA is compensated by a threshold voltage of the driving transistor T1 and then stored in the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and the other electrode of the boost capacitor $C_{boost}$ (hereinafter, referred to as an upper boost electrode). The third transistor T3 is turned on by the positive voltage of a second scan signal GC received through the second scan line 152, and connects the gate electrode of the driving transistor T1 and the second electrode of the driving transistor T1, and transmits the voltage applied to the gate electrode of the driving transistor T1 to the second storage electrode of the storage capacitor Cst and stores it in the storage capacitor Cst. In this case, the voltage stored in the storage capacitor Cst is a voltage of the gate electrode of the driving transistor T1 when the driving transistor T1 is turned off, and thus it is stored in a state that the threshold voltage Vth of the driving transistor T1 is compensated.

The fourth transistor T4 is an n-type transistor and has an oxide semiconductor as a semiconductor layer. The fourth transistor T4 initializes the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to a second electrode of the third transistor T3, the second storage electrode of the storage capacitor Cst, the gate electrode of the driving transistor T1, and the upper boost electrode of the boost capacitor $C_{boost}$. The fourth transistor T4 is turned on by the positive voltage of the initialization control signal GI received through the initialization control line 153, and in this case, the first initialization voltage Vint is transmitted to the gate electrode of the driving transistor T1, the second storage electrode of the storage capacitor Cst, and the upper boost electrode of the boost capacitor $C_{boost}$ for initialization.

The fifth transistor T5 and the sixth transistor T6 are p-type transistors, and have a silicon semiconductor as a semiconductor layer.

The fifth transistor T5 serves to transmit the driving voltage ELVDD to the driving transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the driving transistor T1.

The sixth transistor T6 serves to transmit the light emitting current output from the driving transistor T1 to the light emitting diode LED. A gate electrode of the sixth transistor T6 is connected to the light emission control line 155, a first electrode of the sixth transistor T6 is connected to the second electrode of the driving transistor T1, and a second electrode of the sixth transistor T6 is connected to the anode of the light emitting diode LED.

The seventh transistor T7 is a p-type or n-type transistor, and has a silicon semiconductor or an oxide semiconductor as a semiconductor layer. The seventh transistor T7 initializes the anode of the light emitting diode LED. A gate electrode of seventh transistor T7 is connected to a first scan line 151, a first electrode of the seventh transistor T7 is connected to the anode of light emitting diode LED, and a second electrode of the seventh transistor T7 is connected to a second initialization voltage line 128. When the seventh transistor T7 is turned on by the negative voltage of the first scan line 151, the second initialization voltage AVint is applied to the anode of the light emitting diode LED and initialized. The gate electrode of the seventh transistor T7 is connected to a separate bypass control line and thus may be controlled by separate wiring from the first scan line 151. In addition, depending on embodiments, the second initialization voltage line 128 to which the second initialization voltage AVint is applied may be the same as the first initialization voltage line 127 to which the first initialization voltage Vint is applied.

Although it has been described that one pixel PX includes seven transistors (T1 to T7) and two capacitors (storage capacitor Cst and boost capacitor $C_{boost}$), the embodiments described herein are not limited thereto, and the boost capacitor $C_{boost}$ may be excluded depending on different implementations of the embodiments. In addition, although the third transistor and the fourth transistor are n-type transistors according to the embodiment, only one of them may be formed as the n-type transistor or the other transistor may be formed as the n-type transistor. In addition, as another embodiment, all of the seven transistors can be changed to P-type transistors or N-type transistors.

Hereinabove, the circuit structure of the pixel formed in the display area DA has been described with reference to FIG. 7.

Hereinafter, a structure of the peripheral area PA of the display panel DP will be described in detail with reference to FIG. 8.

Figure 8:
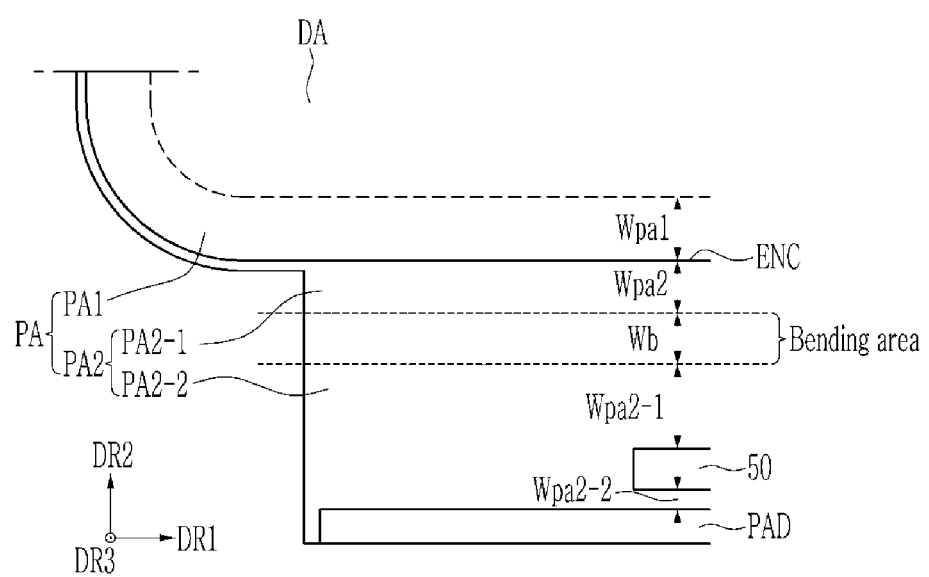
FIG. 8 is an enlarged top plan view of the peripheral area of the light emitting display panel according to the embodiment.

FIG. 8 is an enlarged top plan view of the peripheral area of the light emitting display panel according to the embodiment.

The peripheral area PA may include the first peripheral area PA1 disposed at an outer side of the display area DA, and the second peripheral area PA2 including the driver 50, the pad portion PAD, the connection wire, and the bending area.

The first peripheral area PA1 is disposed while surrounding the outer side of the display area DA, and indicates from a position where the display area DA ends to a position where an encapsulation layer ENC extended from the display area DA ends. That is, the encapsulation layer ENC is formed in the display area DA, and extends to the peripheral area PA, particularly, to between the bending area BA of the peripheral area PA and the display area DA. Here, the peripheral area PA where the encapsulation layer ENC is formed is called the first peripheral area PA1.

The second peripheral area PA2 includes a 2-1 peripheral area PA2-1 and a 2-2 peripheral area PA2-2 disposed on both sides around the bending area.

The 2-1 peripheral area PA2-1 indicates from the position where the encapsulation layer ENC ends to the bending area, and the 2-2 peripheral area PA2-2 indicates up to the end of the pad portion PAD from the end of the bending area through the driver 50. The driver 50 may further include a pad portion for a driver (refer to the IC Pad in FIG. 11) to be electrically connected to the driver 50 mounted in the form of a chip. The pad portion PAD located at the end of the 2-2 peripheral area PA2-2 is also called a pad portion for a circuit board (FPCB Pad in FIG. 11), and is a part electrically connected to the pad of the flexible printed circuit board FPCB.

In FIG. 8, a width of each area of the peripheral area is illustrated, and the first peripheral area PA1 has a width Wpa1, the 2-1 peripheral area PA2-1 has a width Wpa2, a portion of the 2-2 peripheral area PA2-2 to the driver 50 has a width Wpa2-1, and a width between the driver 50 and the pad portion PAD has a width Wpa2-2. Here, a width of the bending area has a width Wb, and when a width Wb of the bending area is 1, the width Wpa1 of the first peripheral area PA1 may have a value of 0.7 to 0.9, the width Wpa2 of the 2-1 peripheral area PA2-1 may have a value of 0.4 to 0.6, the width Wpa2-1 of the 2-2 peripheral area PA2-2 to the driver 50 may have a value of 1.1 to 1.5, and the width Wpa2-2 between the driver 50 and the pad portion PAD may have a value of 0.3 to 0.6. Here, the width Wb of the bending area may vary depending on embodiments, and may have a value of 1000 mm or more and 1200 mm or less (e.g., 1172 mm), the width of the pad portion PAD (i.e. the pad portion for the circuit board) may have a value of 750 mm or more and 900 mm or less, and the width of the driver 50 may have a value of 1500 mm or more and 1800 mm or less.

In the light emitting display panel having the above-described planar structure, the light emitting display device is formed with the bending area actually folded back, and the folded state will be described with reference to FIG. 9.

Figure 9:
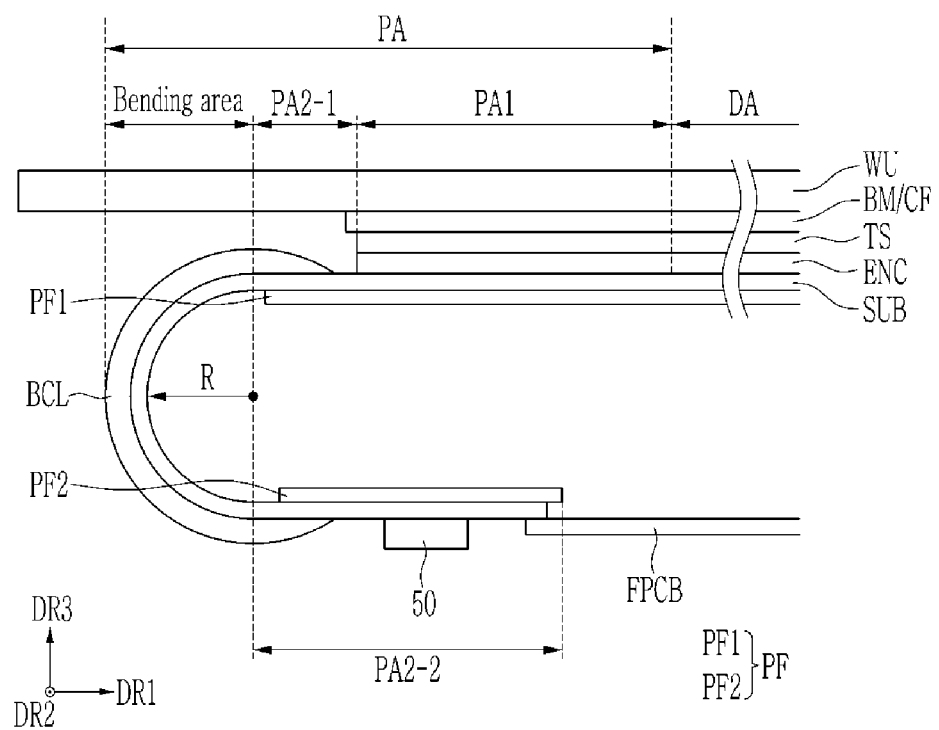
FIG. 9 is an enlarged cross-sectional view of a part of the light emitting display device according to the embodiment.

FIG. 9 is an enlarged cross-sectional view of a part of the light emitting display device according to the embodiment.

Compared to FIG. 2, the housing member HM and the optical element ES are excluded in FIG. 9. The light emitting display device may be accommodated in the housing member HM while being folded back as shown in FIG. 9.

In FIG. 9, the light emitting display panel is divided into the substrate SUB, the encapsulation layer ENC, the touch sensing portion TS, the light blocking layer BM, and a color filter layer CF.

The cover window WU is disposed on a front side of the light emitting display panel, that is, on the light blocking layer BM and the color filter layer CF in the third direction DR3, and the substrate SUB extends to the bending area 'Bending area' folded back, and the peripheral area PA.

The bending area 'Bending area' of the light emitting display panel may further include a bending cover layer BCL, and the bending cover layer BCL may be formed of an organic material.

A radius R value of the bending area 'Bending area' may have a value of 0.25 mm or more and 0.45 mm or less, and when the radius R of the bending area 'Bending area' is 0.35 mm, the bending area may have a length of about 1172 mm, which is the length of a semicircle.

In the peripheral area PA, the 2-2 peripheral area PA2-2, which is an area from the end of the bending area 'Bending area' to the end of the pad portion PAD through the driver 50, may be disposed on the rear surface of the light emitting display panel and thus may be hidden from the front. In addition, the driver 50 disposed in the 2-2 peripheral area PA2-2 and the flexible printed circuit board FPCB extended in the 2-2 peripheral area PA2-2 are also disposed on the rear surface such that they may be hidden from the front.

A protective film PF is attached to the rear surface of the substrate SUB to protect the substrate SUB and the rear surface of the light emitting display panel, and a protective film PF for the rear surface may not be formed in the bending area 'Bending area' such that the bending area 'Bending area' can be folded easily. Referring to the embodiment of FIG. 9, the protective film PF includes a first protective film PF1 corresponding to the display area DA and a part of the peripheral area (first peripheral area PA1 and 2-1 peripheral area PA2-1), and a second protective film PF2 corresponding to the 2-2 peripheral area PA2-2.

In FIG. 9, it is illustrated that two protective films PF1 and PF2 that are adjacent to each other in the third direction DR3 are distanced away from each other, but they may be actually almost bonded to each other.

Hereinafter, referring to FIG. 10, a relationship between the bending area 'Bending area' and an area where the protective film PF is not formed on the rear surface (hereinafter, also referred to as an opening OPPF of the protective film) will be described.

Figure 10:
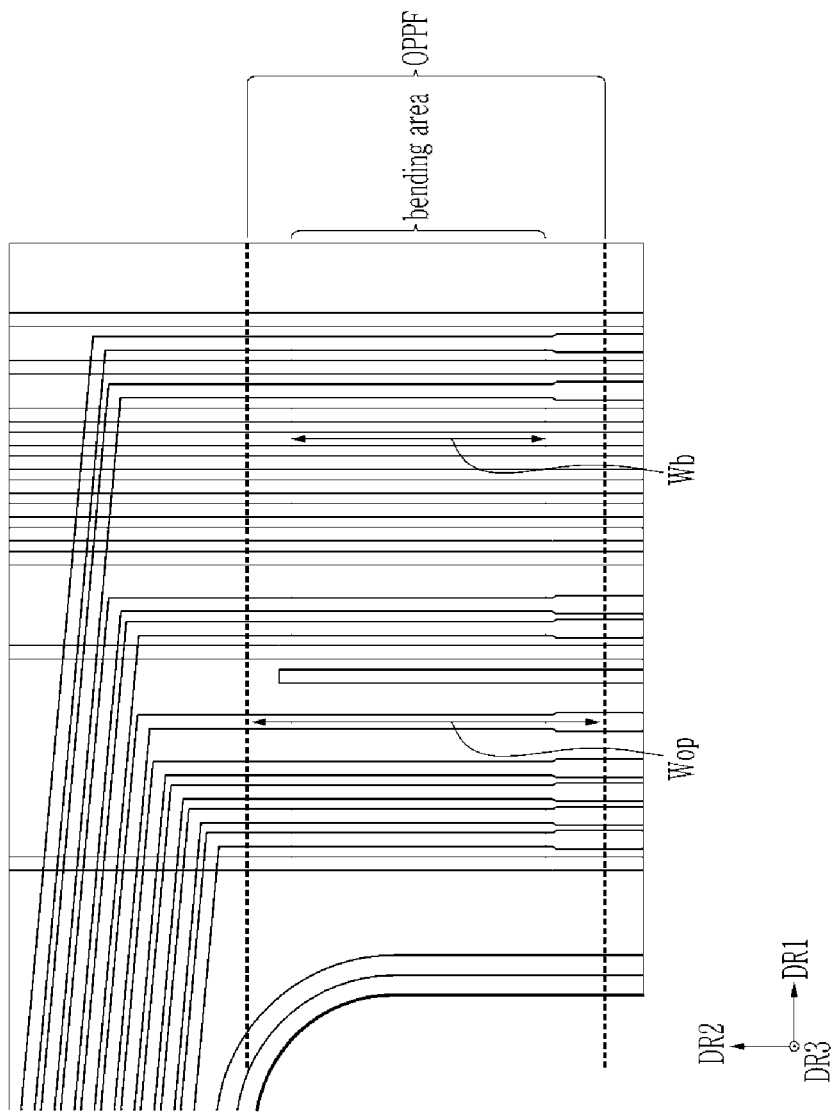
FIG. 10 is an enlarged top plan view of the bending area of the light emitting display panel according to the embodiment.

FIG. 10 is an enlarged top plan view of the bending area of the light emitting display panel according to the embodiment.

In FIG. 10, a part of the peripheral area PA in the bending area 'Bending area' is enlarged, and the opening OPPF of the protective film where the bending area 'Bending area' and the protective film PF are formed on the rear surface are illustrated through the dotted line.

As shown in FIG. 10, the opening OPPF of the protective film is formed larger than the bending area 'Bending area', and a width Wop of the opening OPPF of the protective film is formed larger than a width Wb of the bending area 'Bending area'. Such a structure in which the width Wop of the opening OPPF of the protective film PF is formed larger than the width Wb of the bending area 'Bending area' to prevent the protective film PF from interfering with the back folding due to the protective film PF.

Hereinabove, it was described that the protective film PF is not disposed on the rear surface of the bending area 'Bending area' to facilitate back folding of the bending area 'Bending area'.

Hereinafter, a cross-section structure of a light emitting display panel according to an embodiment will be described with reference to FIG. 11.

Figure 11:
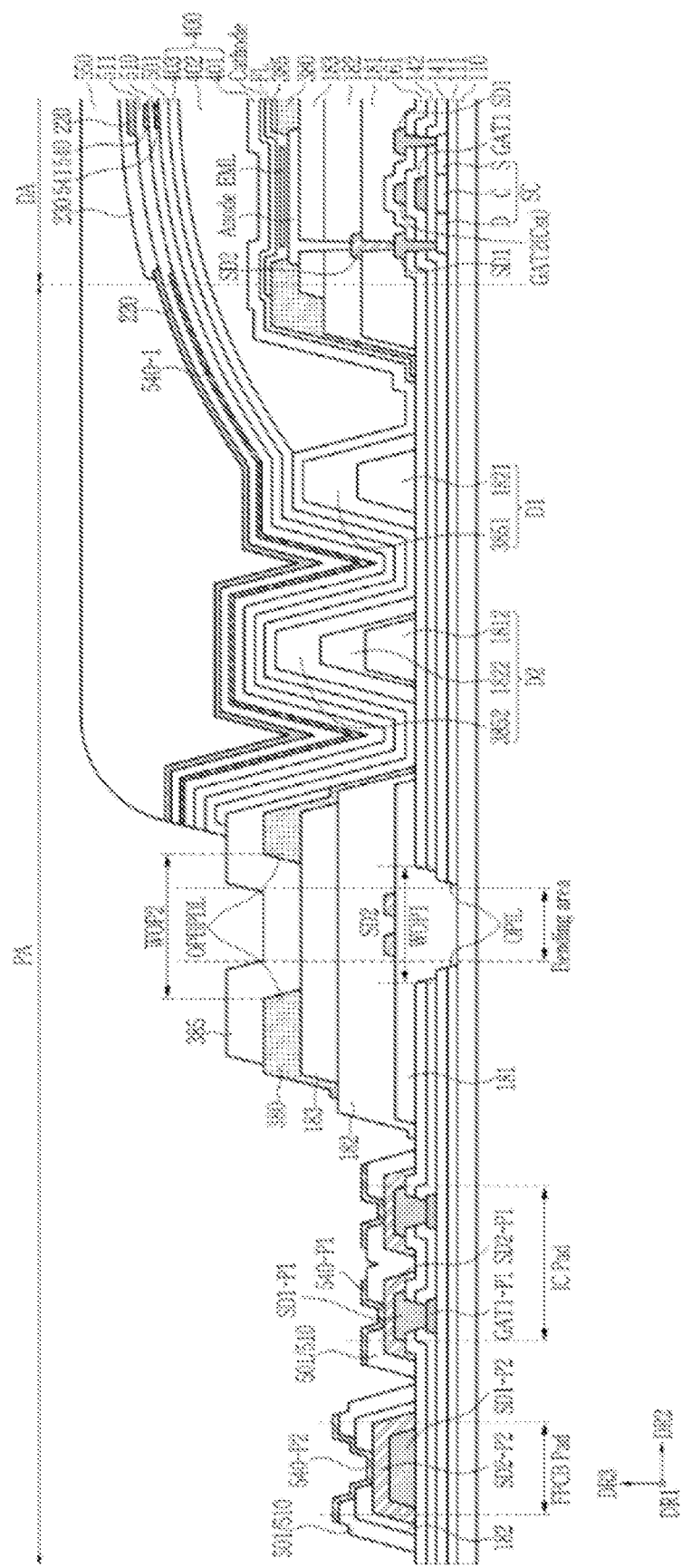
FIG. 11 is a cross-sectional view of a peripheral area of a light emitting display panel according to another embodiment.

FIG. 11 is a cross-sectional view of a peripheral area of a light emitting display panel according to another embodiment.

In FIG. 11, a display area DA and a peripheral area PA are illustrated, and a bending area 'Bending area' and a pad area among a first peripheral area PA1 and a second peripheral area PA2 of the peripheral area PA are shown. Here, the pad area includes a pad portion for a driver (i.e., an IC pad) and a pad portion for a circuit board (i.e., an FPCB pad). The pad portion for the driver (IC Pad) is a pad portion for mounting the driver 50 in the form of a chip, and the pad portion for the circuit board (FPCB Pad) is a pad portion electrically connected to the pad of the flexible printed circuit board FPCB. Here, the pad portion for the driver (IC Pad) may be electrically connected to a conductive layer (fan-out wiring) disposed in the bending area 'Bending area', and may also be electrically connected to the driver 50.

First, a layered structure of the bending area 'Bending area' of the light emitting display panel of FIG. 11 will be described.

In the bending area 'Bending area', a first organic layer 181, a second organic layer 182, a third organic layer 183, and a spacer layer 385 may be disposed on a substrate 110. As a conductive layer (hereinafter, also referred to as a fan-out wire) disposed in the bending area 'Bending area', a single conductive layer (i.e., a second data conductive layer SD2) may be disposed. The second data conductive layer SD2 will be described in detail later with reference to FIG. 14. Depending on embodiments, in the bending area, the second organic layer 182 or the third organic layer 183 may be omitted, or a first data conductive layer SD1 may be included. In addition, a part of the inorganic layers may be disposed. Here, the spacer layer 385 may be a layer formed of the same material as the spacer (refer to the spacer 385-1 and spacer 385-2 in FIG. 14) formed in the display area DA.

Referring to FIG. 11, an opening OPIL (hereinafter, also referred to as a first opening) is formed in a plurality of inorganic layers ILs disposed on the substrate 110 while being adjacent to the bending area 'Bending area' such that no inorganic layer is included in the bending area 'Bending area'. In addition, an opening OPBPDL (hereinafter, also referred to as a second opening) is formed in a black pixel defining layer 380 disposed on the third organic layer 183 such that the black pixel defining layer 380 may not be formed in the bending area 'Bending area'. In addition, a planarization layer 550 disposed on the spacer layer 385 may be removed corresponding to the bending area 'Bending area' or an opening OPOC (hereinafter, also referred to as a third opening) is formed such that the planarization layer 550 may also not be formed in the bending area 'Bending area'.

Since the bending area 'Bending area' is disposed in the peripheral area PA, the light blocking layer BM and the color filter CF disposed in the display area DA may also not be formed in the bending area 'Bending area'.

Here, the plurality of inorganic layers ILs may include a buffer layer, a first gate insulating layer, a second gate insulating layer, a first interlayer insulating layer, a third gate insulating layer, and a second interlayer insulating layer. Each inorganic layer may include a silicon oxide (SiOx), a silicon nitride (SiNx), a silicon oxynitride (SiNxOy), and the like such that the inorganic layers may not be formed in the bending area 'Bending area'. The opening OPIL of the inorganic layer ILs may be formed to have a wider width than the bending area 'Bending area'.

A first organic layer 181 is filled in the opening OPIL of the plurality of inorganic layers ILs. The first organic layer 181 may be an organic insulator including an organic material, and the organic material may include at least one material selected from a group consisting of polyimide, polyamide, acryl resin, benzocyclobutene, and phenol resin.

In the bending area 'Bending area', the second data conductive layer SD2 may pass through while extending in the second direction DR2 on the first organic layer 181. The second data conductive layer SD2 may be formed while contacting the upper surface of the plurality of inorganic layers ILs at both sides of the bending area 'Bending area'. However, depending on embodiments, the first organic layer 181 may be formed on both sides of the bending area 'Bending area' such that the first organic layer 181 and the second data conductive layer SD2 may be formed while being in contact with each other.

In the bending area, other conductive layers may not be disposed except for the second data conductive layer SD2, and a semiconductor layer including a channel of a transistor may not be included. The second data conductive layer SD2 may be wiring that connects the signal line disposed in the display area DA and the driver 50.

The second data conductive layer SD2 is covered by the second organic layer 182, and the third organic layer 183 covers the second organic layer 182. The second organic layer 182 and the third organic layer 183 may include at least one material selected from a group consisting of polyimide, polyamide, acryl resin, benzocyclobutene, and phenol resin.

Since the bending area 'Bending area' is included in the peripheral area PA, an anode Anode, an emission layer EML, a functional layer FL, and a cathode Cathode disposed on the third organic layer 183 in the display area DA may not be included in the bending area 'Bending area'.

The black pixel defining layer 380 is disposed on the third organic layer 183 in the peripheral area PA, but the black pixel defining layer 380 includes the opening OPBPDL in an area corresponding to the bending area 'Bending area' and thus the black pixel defining layer 380 is not formed in the bending area 'Bending area'. Here, the opening OPBPDL of the black pixel defining layer 380 may be formed wider than the bending area 'Bending area'. The black pixel defining layer 380 may further include a light blocking material in addition to the organic insulating material. The light blocking material may include a resin or paste containing carbon black, carbon nanotubes, black dye, metal particles, for example, nickel, aluminum, molybdenum, and an alloy thereof, metal oxide particles (e.g., chromium nitride) and the like. The black pixel defining layer 380 may be formed of an organic material with a negative type of black color. A negative type organic material can be used. The opening OPBPDL of the black pixel defining layer 380 may be formed to be larger than the width of the bending area 'Bending area'.

Figure 14:
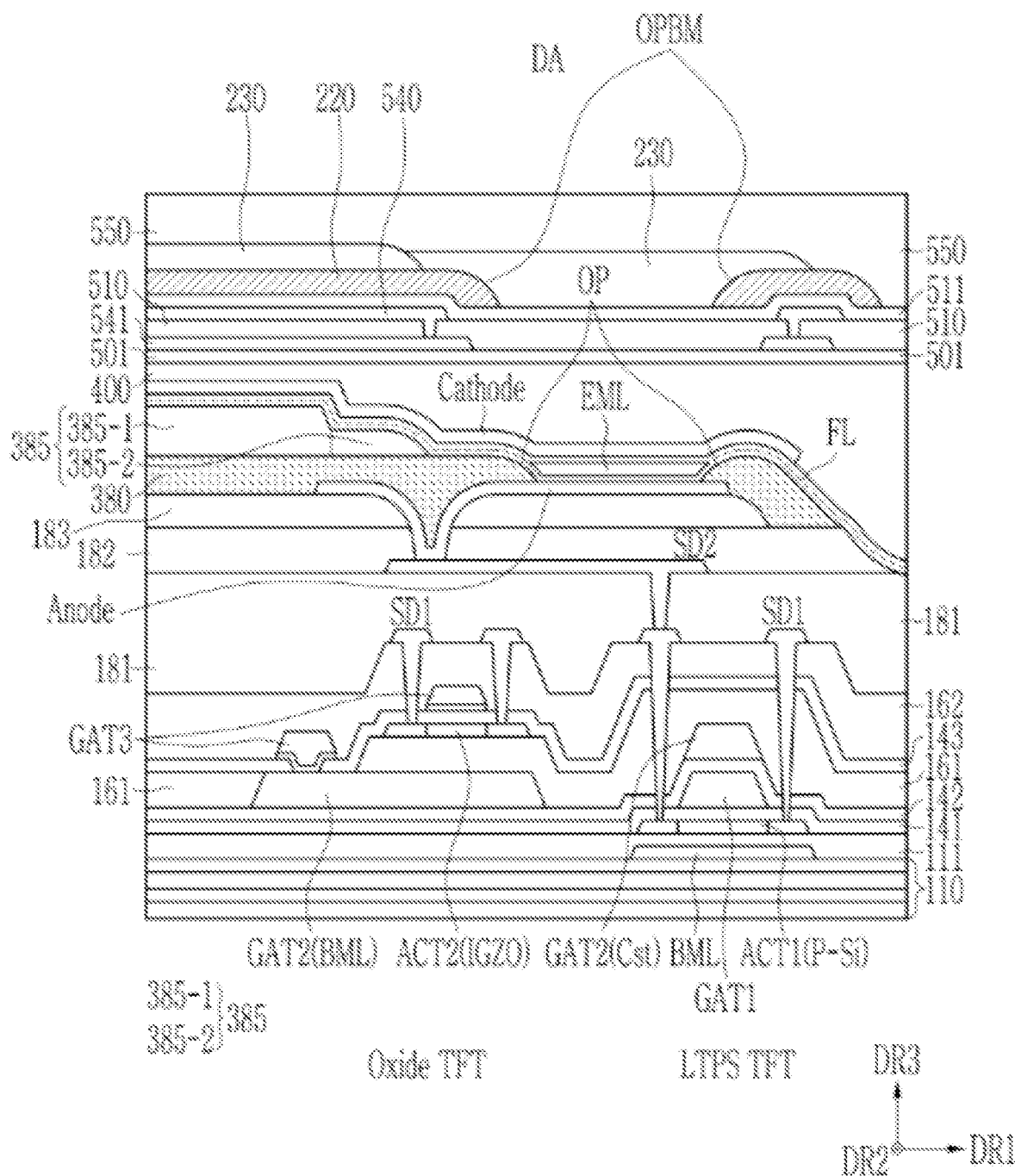
FIG. 14 is a schematic cross-sectional view of a light emitting display panel according to an embodiment.

The spacer layer 385 is formed on the black pixel defining layer 380, and the spacer layer 385 is also filled in the opening OPBPDL of the black pixel defining layer 380. In addition, the spacer layer 385 may also be disposed on the black pixel defining layer 380. As a result, the spacer layer 385 is formed in the bending area 'Bending area'. The spacer layer 385 is a layer on which a spacer 385-1 and a spacer 385-2 is formed in the display area DA, and as shown in FIG. 14, the spacer layer 385 may be formed in a structure having a step difference. The spacer layer 385 of FIG. 14 may include a first portion 385-1 located in a high and narrow area and a second portion 385-2 located in a low and wide area, and the second portion 385-2 may be connected to the first portion 385-1 to have an integrated structure.

The spacer layer 385 may be formed of photosensitive polyimide (PSPI), and may be formed of a positive type of photosensitive organic material. The spacer layer 385 may have a positive characteristic, and may have the same height as the maximum height of the spacer layer 385 disposed in the display area DA.

Although the encapsulation layer ENC is disposed in the display area DA, and the bending area 'Bending area' is disposed in the peripheral area PA outside the encapsulation layer ENC, and thus the encapsulation layer ENC is not disposed in the bending area 'Bending area'. In addition, since the bending area 'Bending area' is disposed in the peripheral area PA, the light blocking layer BM and the color filter CF disposed in the display area DA may not be formed. In addition, the anode, the emission layer, the functional layer, and the cathode constituting the light emitting diode LED may not be formed in the bending area 'Bending area'.

The planarization layer 550 is disposed on the spacer layer 385 of the peripheral area PA, but the planarization layer 550 is not disposed in the bending area 'Bending area' because an opening OPOC is formed in the planarization layer 550 corresponding to the bending area 'Bending area'. The opening OPOC of the planarization layer 550 may be formed to be larger than the width of the bending area 'Bending area'. The planarization layer 550 is for planarizing the upper surface of the light emitting display panel, and may be a transparent organic insulator containing at least one material selected from a group consisting of polyimide, polyamide, acryl resin, benzocyclobutene, and phenol resin.

Hereinabove, the structure of the bending area 'Bending area' has been described.

With reference to FIG. 11, the display area DA will not be described, and will be described later with reference to FIG. 14.

The peripheral area PA may include a plurality of dams D1 and D2. In FIG. 11, two dams (a single first dam D1 and a single second dam D2) are illustrated, but each of the first and second dams D1 and D2 may be provided in plural. In addition, depending on embodiments, three dams (two first dams D1 and one second dam D2) may be formed. The plurality of dams D1 and D2 are formed on a plurality of inorganic layers (a buffer layer 111, a first gate insulating layer 141, a second gate insulating layer 142, and a first interlayer insulating layer 161) and extend from the display area DA.

The first dam D1 is disposed closer to the display area DA than the second dam D2, and the first dam D1 may have a lower height than the second dam D2.

The first dam D1 may include a first sub-dam region 1821 of the first dam D1 and a second sub-dam region 3851 of the first dam D1. The first sub-dam region 1821 of the first dam D1 may be disposed on the same layer as the second organic layer 182 disposed in the display area DA, and may include the same material. The first sub-dam region 1821 of the first dam D1 may be formed in the same process as the second organic layer 182 disposed in the display area DA. The second sub-dam region 3851 of the first dam D1 may be disposed on the same layer as the spacer layer 385 disposed in the display area DA, and may include the same material. The second sub-dam region 3851 of the first dam D1 may be formed in the same process as the spacer layer 385 disposed in display area DA.

The second dam D2 may include a first sub-dam region 1812 of the second dam D2, a second sub-dam region 1822 of the second dam D2, and a third sub-dam region 3852 of the second dam D2. The first sub-dam region 1812 of the second dam D2 may be disposed on the same layer as the first organic layer 181 disposed in the display area DA, and may include the same material. The first sub-dam region 1812 of the second dam D2 may be formed in the same process as the first organic layer 181 disposed in the display area DA. The second sub-dam region 1822 of the second dam D2 may be disposed on the same layer as the second organic layer 182 disposed in the display area DA, and may include the same material. The second sub-dam region 1822 of the second dam D2 may be formed in the same process as the second organic layer 182 disposed in the display area DA. The third sub-dam region 3852 of the second dam D2 may be disposed on the same layer as the spacer layer 385 disposed in the display area DA, and may include the same material. The third sub-dam region 3852 of the second dam D2 may be formed in the same process as the spacer layer 385 disposed in the display area DA.

In the embodiment of FIG. 11, the first dam D1 is formed in a double-layer structure and the second dam D2 is formed in a triple-layer structure. However, the embodiments described herein are not limited thereto, and the first dam D1 may be formed in a triple-layer structure and the second dam D2 may be formed in a quadruple-layer structure.

In addition, although the an embodiment is described in which one first dam D1 and one second dam D2 are disposed in the peripheral area PA, the number is not limited and two or more dams may be disposed in the peripheral area PA.

In addition, a first inorganic encapsulation layer 401 extending from the display area DA is disposed on each of the dams D1 and D2. In addition, an organic encapsulation layer 402 extended from the display area DA is disposed on the first inorganic encapsulation layer 401, and the organic encapsulation layer 402 may be disposed on the first dam D1 but may not be disposed on the second dam D2. The first dam D1 may control spreading of a material in the process of forming the organic encapsulation layer 402. The organic encapsulation layer 402 may have a shape that fills a space between the end of the display area DA and the first dam D1. A second inorganic encapsulation layer 403 overlapping the front surface of the substrate 110 may be disposed on the organic encapsulation layer 402. The first inorganic encapsulation layer 401 is in contact with the second inorganic encapsulation layer 403 on the second dam D2 where the organic encapsulation layer 402 is not disposed. Moisture and oxygen from the outside are blocked through a structure in which the first inorganic encapsulation layer 401 contacts the second inorganic encapsulation layer 403.

Sensing insulating layers 501, 510, and 511 and sensing electrodes 540 and 541 are disposed on the second inorganic encapsulation layer 403. A lower sensing insulating layer 501 is disposed on the second inorganic encapsulation layer 403, a lower sensing electrode 541 is disposed on the lower sensing insulating layer 501, an intermediate sensing insulating layer 510 is disposed on the lower sensing electrode 541, an upper sensing electrode 540 is disposed on the intermediate sensing insulating layer 510, and an upper sensing electrode 540 is disposed on the upper sensing electrode 540. The sensing electrodes 540 and 541 are disposed above the display area DA, and connection wiring 540-1 electrically connected to one of the sensing electrodes 540 is formed in the peripheral area PA. The connection wiring 540-1 may be electrically connected to the driver 50.

The light blocking layer 220 and the color filter 230 are disposed on the upper sensing insulating layer 511. The color filter 230 may be disposed only in the display area DA, and the light blocking layer 220 extends to the first peripheral area PA1 in addition to the display area DA.

The planarization layer 550 is disposed on the light blocking layer 220 and the color filter 230. The planarization layer 550 is for planarizing the upper surface of the light emitting display panel, and may be a transparent organic insulator containing at least one material selected from a group consisting of polyimide, polyamide, acryl resin, benzocyclobutene, and phenol resin.

The planarization layer 550 may be continuously formed up to the first peripheral area PA1, may be disposed only in some regions in the other peripheral areas PA, and may not be formed in the bending area 'Bending area' and the pad area (the pad portion for the driver (IC Pad) and the pad portion for the circuit board (FPCB Pad)). The planarization layer 550 may have a structure in contact with the light blocking layer 220 extending from the first peripheral area PA1 to the first peripheral area PAL Hereinafter, a structure of the pad area (the pad portion for the driver (IC Pad) and the pad portion for the circuit board (FPCB Pad)) according to FIG. 11 will be described.

First, the pad portion for the driver (IC Pad) is illustrated as a quadruple layer structure. The pad portion for the driver (IC Pad) includes a second additional pad electrode GAT1-P1 formed as a first gate conductive layer GAT1, a first additional pad electrode SD-P1 formed as a first data conductive layer SD1, a first pad electrode SD2-P1 formed as a second data conductive layer SD2, and a second pad electrode 540-P1 formed as a sensing electrode 540. The first gate insulating layer 141 is disposed below the second additional pad electrode GAT1-P1, and the second gate insulating layer 142 and the first interlayer insulating layer 161 are disposed between the second additional pad electrode GAT1-P1 and the first additional pad electrode SD-P1. The lower sensing insulating layer 501 and the intermediate sensing insulating layer 510 are disposed between the first pad electrode SD2-P1 and the second pad electrode 540-P1.

Depending on embodiments, the pad portion (IC Pad) for the driver may have a double-layer structure or a triple-layer structure, and when having only the double-layer structure, only a first pad electrode SD2-P1 and a second pad electrode 540-P1 can be included, and when having the triple-layer structure, the first pad electrode SD2-P1 and the second pad electrode 540-P1 are included, and additionally, one of the second additional pad electrode GAT1-P1 and the first additional pad electrode SD-P1 can be further included.

The pad portion for the circuit board (FPCB Pad) is illustrated as a triple layer structure. The pad portion for the circuit board (FPCB Pad) may include a first additional pad electrode SD1-P2 formed of the first data conductive layer SD1, a first pad electrode SD2-P2 formed of the second data conductive layer SD2, and a second pad electrode 540-P2 formed of the sensing electrode 540. In the pad portion for the circuit board (FPCB Pad), sensing insulating layers 501 and 510 and a second organic layer 182 are disposed between the first pad electrode SD2-P2 and the second pad electrode 540-P2.

Depending on embodiments, the pad portion (FPCB Pad) for the circuit board may have a double layer structure, and the double layer structure may include the first pad electrode SD2-P2 and the second pad electrode 540-P2.

Hereinafter, a layered structure of the pad portion will be described in more detail with reference to FIG. 12 and FIG. 13.

Figure 12:
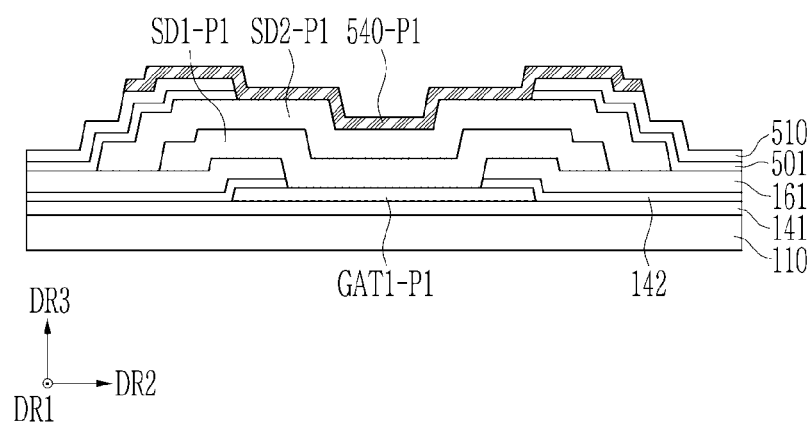
FIG. 12 and FIG. 13 are cross-sectional views of a layered structure of the pad portion of the light emitting display panel according to the embodiment.
Figure 13:
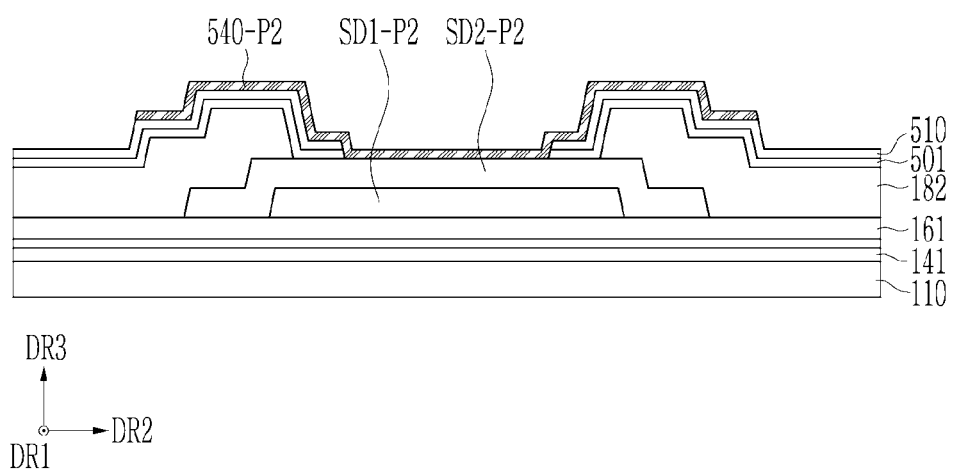

FIG. 12 and FIG. 13 are cross-sectional views of a layered structure of the pad portion of the light emitting display panel according to the embodiment.

FIG. 12 illustrates a layered structure of the pad portion for the driver (IC Pad).

The pad portion for the driver (IC Pad) may have a quadruple layer structure, and may include a second additional pad electrode GAT1-P1 formed of a first gate conductive layer GAT1, a first additional pad electrode SD-P1 formed of a first data conductive layer SD1, a first pad electrode SD2-P1 formed of a second data conductive layer SD2, and a second pad electrode 540-P1 formed of a sensing electrode 540. The first gate insulating layer 141 is disposed below the second additional pad electrode GAT1-P1, and a second gate insulating layer 142 and a first interlayer insulating layer 161 are disposed between the second additional pad electrode GAT1-P1 and the first additional pad electrode SD-P1. The lower sensing insulating layer 501 and the intermediate sensing insulating layer 510 are disposed between the first pad electrode SD2-P1 and the second pad electrode 540-P1.

In FIG. 13, a layered structure of the pad portion for the circuit board (FPCB Pad) is illustrated. The pad portion for the circuit board (FPCB Pad) may have a triple-layer structure, may include a first additional pad electrode SD1-P2 formed of a first data conductive layer SD1, a first pad electrode SD2-P2 formed of a second data conductive layer SD2, and a second pad electrode 540-P2 formed of the sensing electrode 540. Referring to FIG. 13, in the pad portion for the circuit board (FPCB Pad), a second organic layer 182 and the intermediate sensing insulating layer 510 are disposed between the first pad electrode SD2-P2 and the second pad electrode 540-P2.

Referring to the structure of the pad portion of FIG. 12 and FIG. 13, the pad portion for the driver (IC Pad) and the pad portion for the circuit board (FPCB Pad) may have a structure including first pad electrodes SD2-P1 and SD2-P2 formed of the same material as a fan-out wire, which is a conductive layer disposed in the bending area 'Bending area', and second pad electrodes 540-P1 and 540-P2 formed of the same material as one of the sensing electrodes 540 and 541.

In addition, the pad portion for the driver (IC Pad) and the pad portion for the circuit board (FPCB Pad) may further include first additional pad electrodes SD1-P2 and SD1-P2 disposed closer to the substrate 110 than the first pad electrodes SD2-P1 and SD2-P2.

All of the pad portion for the driver (IC Pad) and the pad portion for the circuit board (FPCB Pad) include the first additional pad electrodes SD1-P2 and SD1-P2, and the pad portion for the driver (IC Pad) may further include a second additional pad electrode GAT1-P1 disposed closer to the substrate 110 than the first pad electrode SD2-P1.

Here, the first additional pad electrodes SD1-P2 and SD1-P2 may be formed of the same material as a conductive layer (i.e., the first data conductive layer SD1) that is directly connected with a semiconductor layer where a channel of a transistor disposed in the display area DA is located, and the second additional pad electrode GAT1-P1 may be formed of the same material as a gate electrode of the transistor disposed in the display area DA.

Hereinafter, a cross-sectional structure of a display area DA will be described with reference to FIG. 14.

FIG. 14 is a schematic cross-sectional view of a light emitting display panel according to an embodiment.

Referring to FIG. 14, a detailed layered structure of a pixel of a display area DA will be described. Here, the display area DA may have a layered structure of pixels disposed in a main display area D1 (also referred to as a first display area) and a component area D2 (also referred to as a first element area).

A substrate 110 may include a material that does not bend due to a rigid characteristic such as glass, or a flexible material that can be bent, such as plastic or polyimide. In FIG. 14, a flexible substrate is illustrated, and a structure in which polyimide and a barrier layer formed of an inorganic insulating material and disposed thereon are double formed is illustrated.

A metal layer BML is disposed on the substrate 110, and the metal layer BML is disposed in a region overlapping a channel of a first semiconductor layer ACT1. The metal layer BML is also called a lower shielding layer, and may include a metal or a metal alloy such as copper (Cu), molybdenum (Mo), aluminum (Al), titanium (Ti), and the like, and is formed of a single layer or multiple layers.

A buffer layer 111 covering the metal layer BML may be disposed on top of the metal layer BML, and the buffer layer 111 may be an inorganic insulating layer that serves to block penetration of impurity elements into a first semiconductor layer, and includes a silicon oxide ($SiO_x$) or a silicon nitride ($SiN_x$), a silicon oxynitride ($SiO_xN_y$), and the like.

The first semiconductor layer ACT1 is disposed on the buffer layer 111. The first semiconductor layer ACT1 includes a channel region, and a first region and a second region disposed on both sides of the channel region.

The first gate insulating layer 141 may be disposed to cover the first semiconductor layer ACT1 or to overlap only the channel region of the first semiconductor layer ACT1. The first gate insulating layer 141 may be an inorganic insulating layer that includes a silicon oxide ($SiO_x$) or a silicon nitride ($SiN_x$), a silicon oxynitride ($SiO_xN_y$), and the like A first gate conductive layer GAT1 is disposed on the first gate insulating layer 141, and the first gate conductive layer GAT1 includes a gate electrode of a transistor LTPS TFT including a silicon semiconductor. The first gate conductive layer GAT1 may include a metal such as copper (Cu), molybdenum (Mo), aluminum (Al), titanium (Ti), or a metal alloy, and may be formed as a single layer or multiple layers. A region overlapping the gate electrode of the first semiconductor layer ACT1 on a plane may be a channel region. In addition, the gate electrode may serve as one electrode of the storage capacitor.

The first gate conductive layer GAT1 is covered with a second gate insulating layer 142, and the second gate insulating layer 142 may be an inorganic insulating layer including a silicon oxide ($SiO_x$), a silicon nitride ($SiN_x$), or a silicon oxynitride ($SiO_xN_y$).

The second gate conductive layer GAT2 is disposed on the second gate insulating layer 142, and the second gate conductive layer GAT2 may include a first storage electrode that forms a storage capacitor while overlapping the gate electrode, and a lower shielding layer for an oxide semiconductor transistor disposed below the oxide semiconductor layer ACT2. The second gate conductive layer GAT2 may include a metal or a metal alloy such as copper (Cu), molybdenum (Mo), aluminum (Al), or titanium (Ti), and may be formed as a single layer or multiple layers.

The second gate conductive layer GAT2 is covered by the first interlayer insulating layer 161, and the first interlayer insulating layer 161 may include an inorganic insulating layer including a silicon oxide ($SiO_x$), a silicon nitride ($SiN_x$), a silicon oxynitride ($SiO_xN_y$), and the like.

The oxide semiconductor layer ACT2 is disposed on the first interlayer insulating layer 161, and the oxide semiconductor layer ACT2 includes a channel region, and a first region and a second region disposed on both sides of the channel region.

The oxide semiconductor layer ACT2 is covered by the third gate insulating layer 143, and the third gate insulating layer 143 may include an inorganic insulating layer including a silicon oxide ($SiO_x$), a silicon nitride ($SiN_x$), a silicon oxynitride ($SiO_xN_y$), and the like.

The third gate insulating layer 143 and the first interlayer insulating layer 161 may have an opening overlapping a portion of the lower shielding layer for the oxide semiconductor transistor among the second gate conductive layer GAT2.

A third gate conductive layer GAT3 is disposed on the third gate insulating layer 143, and the third gate conductive layer GAT3 includes a connecting part that is connected with a gate electrode of the oxide semiconductor transistor and the lower shielding layer for the oxide semiconductor transistor. The third gate conductive layer GAT3 may include a metal or a metal alloy such as copper (Cu), molybdenum (Mo), aluminum (Al), or titanium (Ti), and may be formed as a single layer or multiple layers.

The third gate conductive layer GAT3 is covered by the second interlayer insulating layer 162, and the second interlayer insulating layer 162 includes an inorganic insulating layer including a silicon oxide ($SiO_x$), a silicon nitride ($SiN_x$), a silicon oxynitride ($SiO_xN_y$), and the like, and may include an organic material depending on embodiments.

The second interlayer insulating layer 162 and the insulating layer disposed therebelow may include an opening overlapping the first semiconductor layer ACT1 and the oxide semiconductor layer ACT2.

The first data conductive layer SD1 is disposed on the second interlayer insulating layer 162, and the first data conductive layer SD1 includes a connecting part and provides a voltage or a current to the first semiconductor layer ACT1 and the oxide semiconductor layer ACT2 or transmits the voltage or current to another element. The first data conductive layer SD1 may include a metal such as aluminum (Al), copper (Cu), molybdenum (Mo), titanium (Ti), or a metal alloy, and may be formed as a single layer or multiple layers.

The first data conductive layer SD1 is covered by the first organic layer 181. The first organic layer 181 may be an organic insulator including an organic material, and the organic material may include at least one material selected from a group consisting of polyimide, polyamide, acryl resin, benzocyclobutene, and phenol resin.

The first organic layer 181 may include an opening overlapping the first data conductive layer SD1, and the second data conductive layer SD2 is disposed on the first organic layer 181. The second data conductive layer SD2 may be connected to the first data conductive layer SD1 through the opening. The second data conductive layer SD2 may include a metal or a metal alloy such as aluminum (Al), copper (Cu), molybdenum (Mo), or titanium (Ti), and may be formed as a single layer or multiple layers.

The second data conductive layer SD2 is covered by the second organic layer 182. The second organic layer 182 may be an organic insulator, and may include at least one material selected from a group consisting of polyimide, polyamide, acryl resin, benzocyclobutene, and phenol resin. Depending on embodiments, an additional third organic layer may be disposed on top of the second organic layer 182.

An anode 'Anode' may be disposed on the second organic layer 182, and has a structure connected to the second data conductive layer SD2 through an opening disposed on the second organic layer 182. The anode 'Anode' may be formed of a single layer including a transparent conductive oxide layer and a metal material or a multi-layer including the same. The transparent conductive oxide layer may include an indium tin oxide (ITO), a poly-ITO, an indium zinc oxide (IZO), an indium gallium zinc oxide (IGZO), an indium tin zinc oxide (ITZO), and the like, and the metal material may include silver (Ag), molybdenum (Mo), copper (Cu), gold (Au), and aluminum (Al).

A black pixel defining layer 380 that includes an opening overlapping at least a part of the anode 'Anode', and covers the other part of the anode 'Anode' is disposed on the anode 'Anode'. The black pixel defining layer 380 may further include a light blocking material in addition to the organic insulating material. The light blocking material may include a resin or paste containing carbon black, carbon nanotubes, and a black dye, metal particles, for example, nickel, aluminum, molybdenum, and an alloy thereof, metal oxide particles (e.g., chromium nitride), and the like. The black pixel defining layer 380 may be formed of an organic material with a negative type of black color. Since the negative type of organic material is used, it may have a characteristic that a part covered by a mask is removed.

An opening is formed in the black pixel defining layer 380, and an emission layer EML is disposed in the opening. The emission layer EML may be formed of an organic light emitting material, and adjacent emission layers EML may display different colors. On the other hand, depending on embodiments, each emission layer EML may display light of the same color due to a color filter 230 disposed on an upper portion.

A spacer layer 385 comprising a first spacer 385-1 and a second spacer 385-2 is formed on the black pixel defining layer 380.

The spacer layer 385 may be formed in a structure having a step, and the spacer layer 385 includes a first portion (or first spacer) 385-1 disposed in a high and narrow area and a second portion (or second spacer) 385-2 disposed in a low and wide area. The spacer 385 may be formed of photosensitive polyimide (PSPI). The second portion 385-2 may have a height of about 0.4 µm from the upper surface of the black pixel defining layer 380, and may have a height of 0.1 µm or more and 0.5 µm or less depending on embodiments. The first portion 385-1 may have a height of about 1.5 µm from the upper surface of the black pixel defining layer 380. An area ratio where the spacer layer 385 covers the black pixel defining layer 380 may be 50% or more and 95% or less.

A functional layer FL is disposed on the spacer layer 385 and the exposed black pixel defining layer 380, and the functional layer FL may be formed on the entire surface of the light emitting display panel DP. The functional layer FL may include an electron injection layer, an electron transport layer, a hole transport layer, and a hole injection layer, and the functional layer FL may be disposed above and below the emission layer EML. That is, the hole injection layer, the hole transport layer, the emission layer EML, the electron transport layer, the electron injection layer, and the cathode are sequentially disposed on the anode Anode, and thus the hole injection layer and the hole transport layer of the functional layer FL may be disposed below the emission layer EML, and the electron transport layer and the electron injection layer may be disposed above the emission layer EML.

The cathode Cathode may be formed of a light-transmitting electrode or a reflecting electrode. Depending on embodiments, the cathode Cathode may be a transparent or semi-transparent electrode, and may be formed as a metal thin film having a low work function, and including lithium (Li), calcium (Ca), lithium fluoride/calcium (LiF/Ca), lithium fluoride/aluminum (LiF/Al), aluminum (Al), silver (Ag), magnesium (Mg), and a compound thereof. In addition, a transparent conductive oxide (TCO), such as an indium tin oxide (ITO), an indium zinc oxide (IZO), a zinc oxide (ZnO) or an indium oxide (In$_2$O$_3$), may be further disposed on the metal thin film. The cathode may be integrally formed over the entire surface of the light emitting display panel DP except for the light transmissive area.

An encapsulation layer 400 is disposed on the cathode Cathode. The encapsulation layer 400 may include at least one inorganic layer and at least one organic layer, and may have a triple layer structure including a first inorganic encapsulation layer 401, an organic encapsulation layer 402, and a second inorganic encapsulation layer 403. The encapsulation layer 400 may be to protect the emission layer EML formed of an organic material from moisture or oxygen that may be permeated from the outside. Depending on embodiments, the encapsulation layer 400 may include a structure in which an inorganic layer and an organic layer are sequentially further stacked.

Sensing insulating layers 501, 510, and 511 and two sensing electrodes 540 and 541 are positioned on the encapsulation layer 400 for touch sensing. Here, the sensing electrodes 540 and 541 may include a metal or a metal alloy such as aluminum (Al), copper (Cu), silver (Ag), gold (Au), molybdenum (Mo), titanium (Ti), and tantalum (Ta), and may be formed of a single layer or multiple layers.

A light blocking layer 220 and a color filter 230 are disposed on the upper sensing electrodes 540 and 541.

The light blocking layer 220 may be disposed to overlap the sensing electrodes 540 and 541 on a plane, and may be disposed to not overlap with the anode Anode on a plane. This is to prevent the anode Anode and the emission layer EML that can display an image from being covered by the light blocking layer 220 and sensing electrodes 540 and 541.

The color filter 230 is disposed on the sensing insulating layer 510 and the light blocking layer 220. The color filter 230 includes a red color filter that transmits red light, a green color filter that transmits green light, and a blue color filter that transmits blue light. Each color filter 230 may be disposed to overlap the anode Anode of the light emitting diode LED on a plane. Since light emitted from the emission layer EML may be emitted while being changed to a corresponding color while passing through a color filter, all of the light emitted from the emission layer EML may have the same color. However, in the emission layer EML, different colors of light are displayed and the displayed color may be enhanced by passing through a color filter of the same color.

The light blocking layer 220 may be disposed between the respective color filters 230. Depending on embodiments, the color filter 230 may be replaced with a color conversion layer or may further include a color conversion layer. The color conversion layer may include quantum dots.

A planarization layer 550 covering the color filter 230 is disposed on the color filter 230. The planarization layer 550 is for planarizing the upper surface of the light emitting display panel, and may be a transparent organic insulator containing at least one material selected from a group consisting of polyimide, polyamide, acryl resin, benzocyclobutene, and phenol resin.

Depending on embodiments, a low refractive layer and an additional planarization layer may be further disposed on the planarization layer 550 to improve front visibility and light emission efficiency of the display panel. Light can be emitted while being refracted to the front by the low refractive layer and the additional planarization layer having a high refractive characteristic. In this case, the low refractive layer and the additional planarization layer may be disposed directly on the color filter 230 while the planarization layer 550 is omitted according to embodiments.

In the embodiment described herein, a polarizer is not included on the planarization layer 550. That is, the polarizer may serve to prevent display deterioration while the user recognizes external light that is incident and reflected from the anode Anode. However, in the embodiment described herein, a structure in which the black pixel defining layer 380 covers the side surface of the anode Anode to reduce the degree of reflection from the anode Anode, and the light blocking layer 220 is also formed to reduce the incidence of light, thereby preventing deterioration of display quality according to reflection has already been included. Therefore, there is no need to separately form the polarizer on the front of the light emitting display panel DP.

Hereinabove, the layered structure of the pixels has been described with reference to FIG. 14.

Hereinafter, a deformed structure of the bending area according to another embodiment will be described with reference to FIG. 15 to FIG. 17.

First, FIG. 15 will be described.

Figure 15:
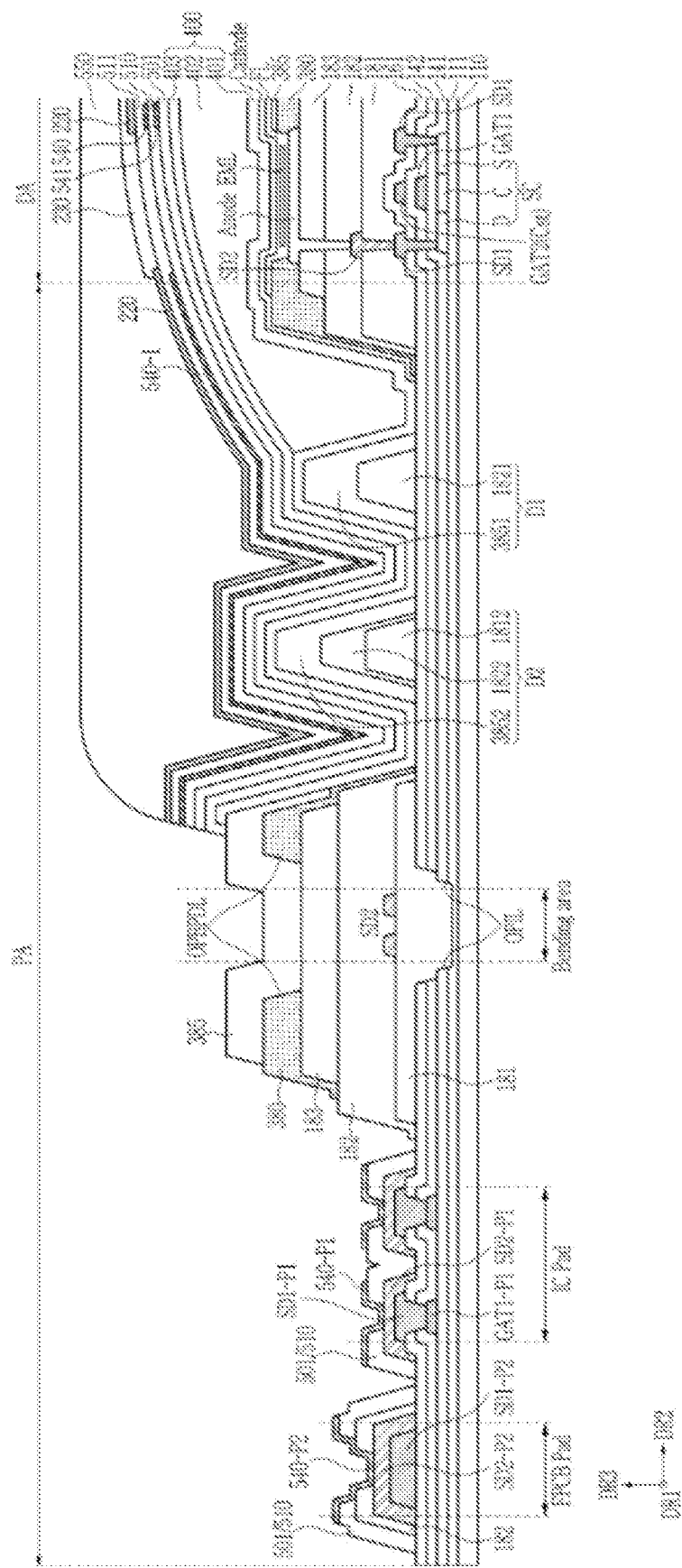
FIG. 15 is a cross-sectional view of a layered structure of a peripheral area of a light emitting display panel according to another embodiment.

FIG. 15 is a cross-sectional view of a layered structure of a peripheral area of a light emitting display panel according to another embodiment.

FIG. 15 corresponds to FIG. 11, and is different from the embodiment of FIG. 11 in a structure of the bending area 'Bending area'.

In a bending area 'Bending area' of an embodiment of FIG. 15, some of a plurality of inorganic layers ILs are formed below a first organic layer 181. In FIG. 15, when an opening OPIL (hereinafter, also referred to as a first opening) is formed in the plurality of inorganic layers ILs corresponding to the bending area 'Bending area', some of the inorganic layers may remain.

That is, the layered structure of the bending area 'Bending area' according to the embodiment of FIG. 15 may be as follows.

In the bending area 'Bending area', some of the inorganic layers, a first organic layer 181, a second organic layer 182, a third organic layer 183, and a spacer layer 385 may be disposed on a substrate 110. One conductive layer (i.e., a second data conductive layer SD2) may be disposed as a conductive layer disposed in the bending area 'Bending area' (hereinafter, also referred to as fan-out wiring).

Referring to FIG. 15, the opening OPIL (hereinafter, also referred to as a first opening) is formed corresponding to the bending area 'Bending area' in the plurality of inorganic layers ILs that are disposed on the substrate 110, while being adjacent to the bending area 'Bending area', but due to the structure in which a part of the inorganic layer is not removed such that a part of the inorganic layer is included in the bending area 'Bending area'. In addition, an opening OPBPDL (hereinafter, also referred to as a second opening) is also formed corresponding to the bending area 'Bending area' in the black pixel defining layer 380 disposed on the third organic layer 183, and thus the black pixel defining layer 380 may not be formed in the bending area 'Bending area'. In addition, the planarization layer 550 disposed on the spacer layer 385 is removed corresponding to the bending area 'Bending area' or an opening OPOC (hereinafter, also referred to as a third opening) is formed such that the planarization layer 550 may not be formed in the bending area 'Bending area'. Since the bending area 'Bending area' is disposed in the peripheral area PA, the light blocking layer BM and the color filter CF formed in the display area DA may not be formed.

Here, the plurality of inorganic layers ILs may include a buffer layer, a first gate insulating layer, a second gate insulating layer, a first interlayer insulating layer, a third gate insulating layer, and a second interlayer insulating layer, and one of the inorganic layers or the plurality of inorganic layers may remain in the bending area 'Bending area'. Each inorganic layer may include a silicon oxide ($SiO_x$), a silicon nitride ($SiN_x$), a silicon oxynitride ($SiO_xN_y$), and the like, and thus in the embodiment of FIG. 15, at least one of a silicon oxide ($SiO_x$), a silicon nitride ($SiN_x$), and a silicon oxynitride ($SiO_xN_y$) may be included in the bending area 'Bending area'. The opening OPIL of the inorganic layer ILs may be formed to have a wider width than the bending area 'Bending area'.

The opening OPIL of the plurality of inorganic layers ILs is filled with the first organic layer 181, and thus, in the embodiment of FIG. 15, the first organic layer 181 is formed on top of some inorganic layers, and a second data conductive layer SD2, a second organic layer 182, a third organic layer 183, and a spacer layer 385 are disposed on the first inorganic layer 181.

The black pixel defining layer 380 is disposed between the third organic layer 183 and the spacer layer 385, but the black pixel defining layer 380 has the opening OPBPDL in an area corresponding to the bending area 'Bending area', and the black pixel defining layer 380 in the bending area 'Bending area' is not formed.

Hereinafter, a deformed structure of the bending area 'Bending area' according to another embodiment will be described with reference to FIG. 16 and FIG. 17.

Figure 16:
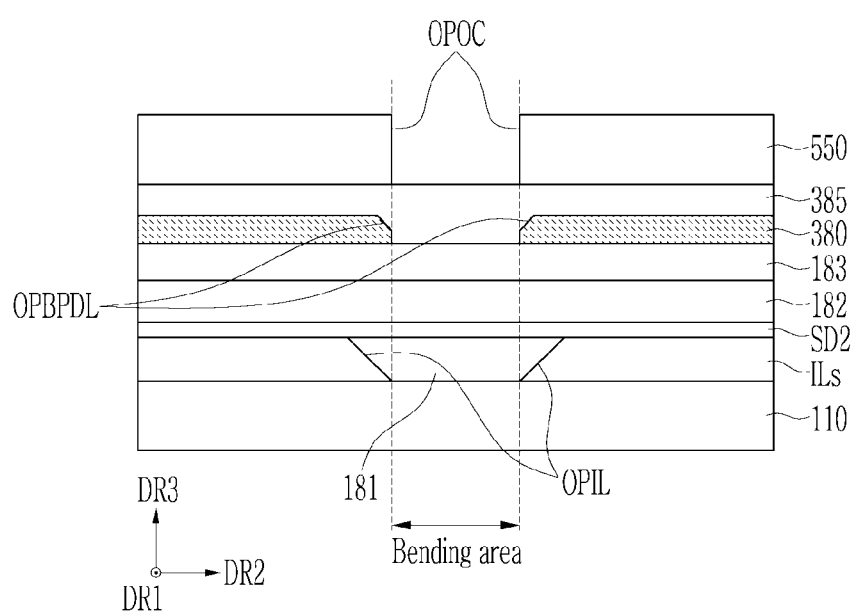
FIG. 16 and FIG. 17 are cross-sectional views of a layered structure of a bending area of a light emitting display panel according to an embodiment.
Figure 17:
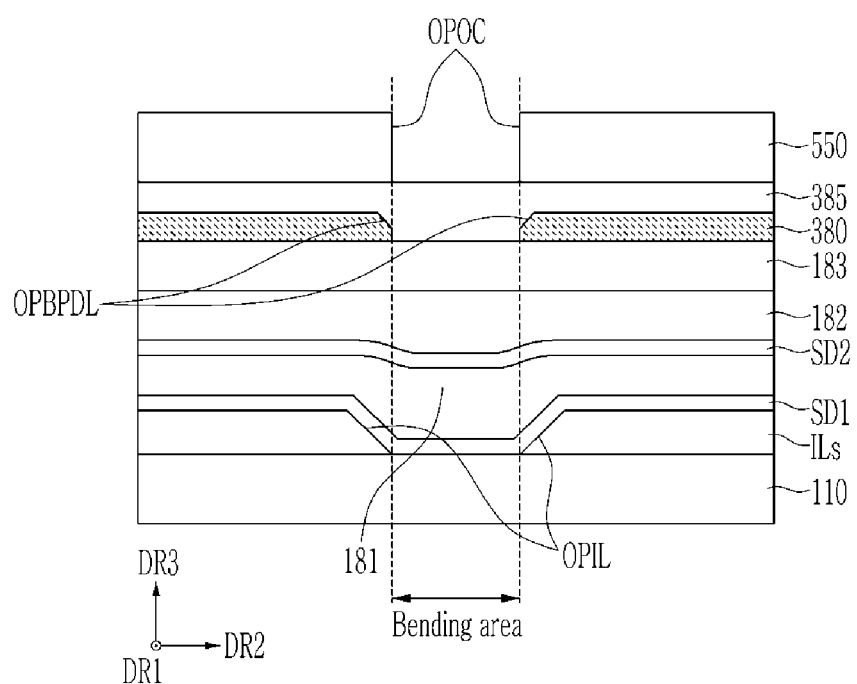

FIG. 16 and FIG. 17 are cross-sectional views of a layered structure of a bending area of a light emitting display panel according to an embodiment.

FIG. 16 and FIG. 17 illustrate only the bending area 'Bending area', and the cross-sectional view of FIG. 16 and FIG. 17 may be cross-sectional views cutting the bending area 'Bending' area along the second direction DR2.

First, in the embodiment of FIG. 16, a first organic layer 181 is not formed above a plurality of inorganic layers ILs, and thus a conductive layer (hereinafter, also referred to as fan-out wiring) formed as a second data conductive layer SD2 directly contacts the plurality of inorganic layers ILs.

In the embodiment of FIG. 16, a thickness of the first organic layer 181 is decreased, and the order of the layers only in the bending area 'Bending area' may be the same as the order shown in FIG. 11.

Meanwhile, in the embodiment of FIG. 17, the fan-out wiring is formed as a second data conductive layer SD2 and a first data conductive layer SD1. As a result, the first data conductive layer SD1 and the second data conductive layer SD2 are also included in the bending area 'Bending area'. Here, the second data conductive layer SD2 is called fan-out wiring, and the fan-out wiring formed as the first data conductive layer SD1 is also called additional fan-out wiring.

A layered structure of the bending area 'Bending area' according to the embodiment of FIG. 17 is as follows.

Referring to FIG. 17, a first data conductive layer SD1, a first organic layer 181, a second data conductive layer SD2, a second organic layer 182, a third organic layer 183, and a spacer layer 385 are sequentially disposed on a substrate 110 in the bending area 'Bending area'.

An opening OPIL (hereinafter, also referred to as a first opening) is formed corresponding to the bending area 'Bending area' in a plurality of inorganic layers ILs disposed on the substrate 110 and thus no inorganic layer is included in the bending area 'Bending area'. In addition, an opening OPBPDL (hereinafter, also referred to as a second opening) is formed corresponding to the bending area 'Bending area' also in a black pixel defining layer 380 that is disposed on the third organic layer 183 and thus the black pixel defining layer 380 may also not be formed in the bending area 'Bending area'. In addition, an opening OPOC (hereinafter, also referred to as a third opening) is formed corresponding to the bending area 'Bending area' in a planarization layer 550 disposed on the spacer layer 385 such that the planarization layer 550 may also not be formed in the bending area 'Bending area'. Since the bending area 'Bending area' is formed in the peripheral area PA, a light blocking layer BM and a color filter CF disposed in the display area DA may not be formed.

Here, the first data conductive layer SD1 may extend along the first opening of the plurality of inorganic layers ILs, and the second data conductive layer SD2 may extend while having a small step in the bending area 'Bending area'.

Hereinabove, different structures of the bending area 'Bending area' have been described with reference to FIG. 11, FIG. 15, FIG. 16, and FIG. 17. However, the embodiments described herein are not limited thereto, and may have a bending area 'Bending area' including characteristics of each bending area 'Bending area' while merging the characteristics, or may be deformed into a bending area 'Bending area' having a structure in which some layers are removed.

A reflection adjusting layer may be disposed on the light blocking layer. The reflection adjusting layer may selectively absorb light of a wavelength of a partial band among light reflected inside the display device or light incident outside the display device. The reflection adjusting layer may fill the opening OP.

For example, the reflection adjusting layer absorbs a first wavelength region of 490 nm to 505 nm and a second wavelength region of 585 nm to 600 nm, and thus light transmittance in the first wavelength region and second wavelength region may be 40% or less. The reflection adjusting layer may absorb light of a wavelength outside the emission wavelength range of red, green, or blue emitted from the light emitting diode ED. As described, the reflection adjusting layer absorbs light of a wavelength that does not belong to a wavelength range of red, green, or blue emitted from the light emitting diode, thereby preventing or minimizing the reduction in luminance of the display device and simultaneously preventing or minimizing the deterioration of the luminous efficiency and improving visibility of the display device.

In the embodiment, the reflection adjusting layer may be provided as an organic material layer including a dye, a pigment, or combination thereof. The reflection adjusting layer may contain a tetraazaporphyrin (TAP)-based compound, a porphyrin-based compound, a metal porphyrin-based compound, an oxazine-based compound, and a squarylium-based compound, a triarylmethane compound, a polymethine compound, an anthraquinone compound, a phthalocyanine compound, an azo compound, a perylene compound, a xanthene-based compound, a diammonium-based compound, a dipyrromethene-based compound, a cyanine-based compound, and a combination thereof.

In the embodiment, the reflection adjusting layer may have transmittance of about 64% to 72%. The transmittance of the reflection adjusting layer may be adjusted according to the content of the pigment and/or dye included in the reflection adjusting layer.

According to embodiments, the reflection adjusting layer may not be disposed in the component area DA2. In addition, an embodiment including the reflection adjusting layer may further include a capping layer and a low reflection layer disposed between the cathode (Cathode) and the encapsulation layer 400.

The capping layer may serve to improve the luminous efficiency of the light emitting diode ED by the principle of constructive interference. The capping layer may include, for example, a material having a refractive index of 1.6 or more for light having a wavelength of 589 nm.

The capping layer may be an organic capping layer including an organic material, an inorganic capping layer including an inorganic material, or a composite capping layer including an organic material and an inorganic material. For example, the capping layer may contain a carbocyclic compound, a heterocyclic compound, an amine group-containing compound, a porphine derivative, a phthalocyanine derivative, a naphthalocyanine derivative, an alkali metal complex, alkaline earth metal complexes, or any combination thereof. The carbocyclic compounds, the heterocyclic compounds, and the amine group-containing compounds may be optionally substituted with substituents including O, N, S, Se, Si, F, Cl, Br, I, or any combination thereof.

A low reflection layer may be disposed on the capping layer. The low reflective layer may overlap a front surface of the substrate SUB.

The low reflective layer may include an inorganic material having low reflectance, and in an embodiment, it may include a metal or metal oxide. When the low reflective layer contains a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and it may include zinc (Zn), germanium (Ge), silver (Ag), magnesium (Mg), gold (Au), copper (Cu), calcium (Ca), or a combination thereof. In addition, when the low reflective layer contains a metal oxide, it may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, or a combination thereof.

In the embodiment, an absorption coefficient (k) of the inorganic material included in the low reflective layer may be 4.0 or less and 0.5 or more ($0.5 \leq k \leq 4.0$). In addition, the inorganic material included in the low reflective layer may have a refractive index (n) of 1 or more ($n \geq 1.0$).

The low reflective layer induces destructive interference between the light incident into the display device and the light reflected from the metal disposed under the low reflective layer, thereby reducing reflection of external light. Accordingly, the display quality and visibility of the display device can be improved by reducing the reflection of the external light of the display device through the low reflective layer.

According to embodiments, the capping layer may not be formed, and then the low reflective layer may be contact the cathode (Cathode) directly.

The encapsulation layer is disposed on the low reflective layer, other structures may be the same as FIG. 14.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting display device comprising:
a substrate that includes a display area and a peripheral area including a bending area,
wherein the display area comprises:
a plurality of inorganic layers;
a first organic layer and a second organic layer that are disposed on the plurality of inorganic layers;
a black pixel defining layer that is disposed on the second organic layer; and
a spacer that is disposed on the black pixel defining layer, and
wherein, in correspondence with the bending area;
the plurality of inorganic layers include a first opening where at least a part of the plurality of inorganic layers is removed at a position corresponding to the bending area;
the first opening is filled with the first organic layer;
the second organic layer is disposed on the first organic layer;
the black pixel defining layer includes a second opening at a position corresponding to the bending area; and
the second opening is filled with an organic layer for the spacer, formed of a same material as the spacer.

2. The light emitting display device of claim 1, further comprising:
a planarization layer that is disposed on the spacer and the organic layer for the spacer,
wherein the planarization layer includes a third opening at a position corresponding to the bending area.

3. The light emitting display device of claim 2, wherein widths of the first opening, the second opening, and the third opening are larger than a width of the bending area.

4. The light emitting display device of claim 3, further comprising:
fan-out wiring that is formed on the bending area and covered by the second organic layer.

5. The light emitting display device of claim 4, wherein the fan-out wiring contacts a top surface of the plurality of inorganic layers formed on the peripheral area that is adjacent to the bending area.

6. The light emitting display device of claim 4, wherein the peripheral area further comprises:
a pad portion for a driver, electrically connected with the fan-out wiring and electrically connected with a chip-type driver; and
a pad portion for a circuit pad, electrically connected with a flexible printed circuit board.

7. The light emitting display device of claim 6, wherein the display area further comprises:
an encapsulation layer that covers a pixel circuit portion, a light emitting diode electrically connected with the pixel circuit portion and the light emitting diode;
a sensing electrode that is formed on the encapsulation layer and senses a touch; and
sensing insulating layers that are disposed above and below the sensing electrode.

8. The light emitting display device of claim 7, wherein the encapsulation layer extends up to between the bending area of the peripheral area and the display area.

9. The light emitting display device of claim 8, wherein each of the pad portion for the driver and the pad portion for the circuit board comprises:
a first pad electrode that is formed of a same material as the fan-out wiring;

a second pad electrode that is formed of a same material as the sensing electrode; and a first additional pad electrode that is disposed closer to the substrate than the first pad electrode.

10. The light emitting display device of claim 9, wherein the pad portion for the driver further comprises a second additional pad electrode that is disposed closer to the substrate than the first additional pad electrode.

11. The light emitting display device of claim 10, wherein the pixel circuit portion comprises a transistor including a semiconductor layer and a gate electrode, the first additional pad electrode is formed of a same material as a conductive layer that is directly connected with a semiconductor layer of the transistor, and the second additional pad electrode is formed of a same material as the gate electrode.

12. The light emitting display device of claim 11, wherein the bending area further comprises additional fan-out wiring that is disposed between the first organic layer and the plurality of inorganic layers, and the additional fan-out wiring is formed of a same material as the first additional pad electrode.

13. The light emitting display device of claim 7, wherein the sensing electrode comprises a connection wire extending to be electrically connected with the driver or the flexible printed circuit board.

14. The light emitting display device of claim 7, wherein a first dam and a second dam that is higher than the first dam in height are disposed on a first peripheral area where the encapsulation layer is formed on the peripheral area, and the second dam is disposed further from the display area than the first dam.

15. The light emitting display device of claim 14, wherein the first dam and the second dam are disposed on the plurality of inorganic layers, the first dam comprises a first sub-dam region of the first dam formed of the second organic layer, and a second sub-dam region of the first dam formed of an organic layer for the spacer, the second dam comprises a first sub-dam region of the second dam formed of the first organic layer, a second sub-dam region of the second dam formed of the second organic layer, and a third sub-dam region of the second dam formed of the organic layer for the spacer.

16. The light emitting display device of claim 14, further comprising:

a planarization layer that is disposed on the spacer and the organic layer for the spacer, wherein a light blocking layer and a color filter are disposed on the sensing electrode and the sensing insulating layers of the display area, and the light blocking layer extends to the first peripheral area and contacts the planarization layer in the first peripheral area.

17. The light emitting display device of claim 1, wherein the spacer of the display area comprises a first portion, and a second portion that is lower than the first portion in height and integrally formed with the first portion.

18. The light emitting display device of claim 1, wherein the light emitting display device does not include a polarizer.

19. A light emitting display device comprising:

a substrate that includes a peripheral area including a plurality of dams and a bending area, and a display area, wherein the plurality of dams is disposed on a plurality of inorganic layers and comprises a first dam; and a second dam that is higher than the first dam in height, and the second dam comprises:
a first sub-dam region of the second dam formed of a first organic layer on the plurality of inorganic layers,
a second sub-dam region of the second dam formed of a second organic layer, and
a third sub-dam region of the second dam that is formed of the same material as a spacer formed in the display area, the first dam comprises:
a first sub-dam region of the first dam formed of a second organic layer on the plurality of inorganic layers, and
a second sub-dam region of the second dam that is formed of the same material as the spacer, and in the bending area,
the plurality of inorganic layers include a first opening where at least a part of the plurality of inorganic layers is removed formed at a position corresponding to the bending area,
the first opening is filled with the first organic layer,
the second organic layer is disposed on the first organic layer, and
a spacer layer that is formed of the same material as the spacer is formed on the second organic layer, a black pixel defining layer is disposed in the display area, and the black pixel defining layer includes a second opening at a position corresponding to the bending area, and the second opening is filled with the spacer layer.

20. The light emitting display device of claim 19, further comprising:

a planarization layer that is disposed on the spacer and the spacer layer, wherein the planarization layer comprises a third opening at a position corresponding to the bending area.

21. The light emitting display device of claim 19, wherein the light emitting display device does not include a polarizer.

22. An electronic device comprising:

a light emitting display device, and a control module controlling the light emitting display device, wherein the light emitting display device comprises:
a substrate that includes a display area and a peripheral area including a bending area, the display area comprises:
a plurality of inorganic layers;
a first organic layer and a second organic layer that are disposed on the plurality of inorganic layers;
a black pixel defining layer that is disposed on the second organic layer; and
a spacer that is disposed on the black pixel defining layer, and in correspondence with the bending area:
the plurality of inorganic layers include a first opening where at least a part of the plurality of inorganic layers is removed at a position corresponding to the bending area;
the first opening is filled with the first organic layer;
the second organic layer is disposed on the first organic layer;
the black pixel defining layer includes a second opening at a position corresponding to the bending area; and the second opening is filled with an organic layer for the spacer, formed of a same material as the spacer.

23. The electronic device of claim 22, further comprising:
a planarization layer that is disposed on the spacer and the organic layer for the spacer,
wherein the planarization layer includes a third opening at a position corresponding to the bending area.

24. The electronic device of claim 23, wherein widths of the first opening, the second opening, and the third opening are larger than a width of the bending area.

25. The electronic device of claim 24, further comprising:
fan-out wiring that is formed on the bending area and covered by the second organic layer.

26. The electronic device of claim 25, wherein the fan-out wiring contacts a top surface of the plurality of inorganic layers formed on the peripheral area that is adjacent to the bending area.

27. The electronic device of claim 25, wherein the peripheral area further comprises:
a pad portion for a driver, electrically connected with the fan-out wiring and electrically connected with a chip-type driver, and
a pad portion for a circuit pad, electrically connected with a flexible printed circuit board.

28. The electronic device of claim 27, wherein the display area further comprises:
an encapsulation layer that covers a pixel circuit portion, a light emitting diode electrically connected with the pixel circuit portion and the light emitting diode;
a sensing electrode that is formed on the encapsulation layer and senses a touch; and
sensing insulating layers that are disposed above and below the sensing electrode.

29. The electronic device of claim 28, wherein the encapsulation layer extends up to between the bending area of the peripheral area and the display area.

30. The electronic device of claim 29, wherein each of the pad portion for the driver and the pad portion for the circuit board comprises:
a first pad electrode that is formed of a same material as the fan-out wiring;
a second pad electrode that is formed of a same material as the sensing electrode; and
a first additional pad electrode that is disposed closer to the substrate than the first pad electrode.

31. The electronic device of claim 30, wherein the pad portion for the driver further comprises a second additional pad electrode that is disposed closer to the substrate than the first additional pad electrode.

32. The electronic device of claim 31, wherein
the pixel circuit portion comprises a transistor including a semiconductor layer and a gate electrode,
the first additional pad electrode is formed of a same material as a conductive layer that is directly connected with a semiconductor layer of the transistor, and
the second additional pad electrode is formed of a same material as the gate electrode.

33. The electronic device of claim 32, wherein
the bending area further comprises additional fan-out wiring that is disposed between the first organic layer and the plurality of inorganic layers, and
the additional fan-out wiring is formed of a same material as the first additional pad electrode.

34. The electronic device of claim 28, wherein the sensing electrode comprises a connection wire extending to be electrically connected with the driver or the flexible printed circuit board.

35. The electronic device of claim 28, wherein
a first dam and a second dam that is higher than the first dam in height are disposed on a first peripheral area where the encapsulation layer is formed on the peripheral area, and
the second dam is disposed further from the display area than the first dam.

36. The electronic device of claim 35, wherein
the first dam and the second dam are disposed on the plurality of inorganic layers,
the first dam comprises a first sub-dam region of the first dam formed of the second organic layer, and a second sub-dam region of the first dam formed of an organic layer for the spacer,
the second dam comprises a first sub-dam region of the second dam formed of the first organic layer, a second sub-dam region of the second dam formed of the second organic layer, and a third sub-dam region of the second dam formed of the organic layer for the spacer.

37. The electronic device of claim 35, further comprising:
a planarization layer that is disposed on the spacer and the organic layer for the spacer, wherein
a light blocking layer and a color filter are disposed on the sensing electrode and the sensing insulating layers of the display area, and
the light blocking layer extends to the first peripheral area and contacts the planarization layer in the first peripheral area.

38. The electronic device of claim 22, wherein the spacer of the display area comprises a first portion, and a second portion that is lower than the first portion in height and integrally formed with the first portion.

39. The electronic device of claim 22, wherein the light emitting display device does not include a polarizer.

* * * * *